(12) United States Patent
Bencher et al.

(10) Patent No.: US 7,608,300 B2
(45) Date of Patent: Oct. 27, 2009

(54) METHODS AND DEVICES TO REDUCE DEFECTS IN DIELECTRIC STACK STRUCTURES

(75) Inventors: Christopher Dennis Bencher, San Jose, CA (US); Lee Luo, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 497 days.

(21) Appl. No.: 10/650,941

(22) Filed: Aug. 27, 2003

(65) Prior Publication Data

US 2005/0045099 A1    Mar. 3, 2005

(51) Int. Cl.
*C23C 16/00* (2006.01)
*B05D 1/40* (2006.01)
*H05H 1/00* (2006.01)
*H05H 1/32* (2006.01)

(52) U.S. Cl. ............... 427/248.1; 427/255.6; 427/331; 427/535; 427/540

(58) Field of Classification Search .............. 427/248.1, 427/255.6, 331, 535, 540
See application file for complete search history.

(56) References Cited

U.S. PATENT DOCUMENTS

| | | | |
|---|---|---|---|
| 5,186,120 A | 2/1993 | Ohnishi et al. | |
| 5,204,314 A | 4/1993 | Kirlin et al. | |
| 5,345,079 A | 9/1994 | French et al. | |
| 5,536,323 A | 7/1996 | Kirlin et al. | |
| 5,702,532 A | 12/1997 | Wen et al. | |
| 5,711,816 A | 1/1998 | Kirlin et al. | |
| 5,766,360 A | 6/1998 | Sato et al. | |
| 5,835,677 A | 11/1998 | Li et al. | |
| 5,869,149 A | 2/1999 | Denison et al. | |
| 5,876,503 A | 3/1999 | Roeder et al. | |
| 5,925,189 A | 7/1999 | Nguyen et al. | |
| 5,935,283 A | 8/1999 | Sweeney et al. | |
| 6,179,277 B1 | 1/2001 | Huston et al. | |
| 6,261,374 B1 | 7/2001 | Bang et al. | |
| 6,270,859 B2 * | 8/2001 | Zhao et al. | 427/535 |
| 6,332,470 B1 | 12/2001 | Fishkin et al. | |
| 6,345,642 B1 | 2/2002 | Yoshidome et al. | |

(Continued)

OTHER PUBLICATIONS

Takeishi et al., "Stabilizing Dielectric Constants of Fluorine-Doped-$SiO_2$ Films by $N_2O$-Plasma Annealing," *DUMIC Conf. 1995 ISMIC*, Executive Summary and Extended Abstract, Feb. 21-22, 1995.

*Primary Examiner*—Timothy Meeks
*Assistant Examiner*—Kelly M Gambetta
(74) *Attorney, Agent, or Firm*—Townsend and Townsend and Crew, LLP

(57) ABSTRACT

A variety of techniques may be employed alone or in combination to reduce the incidence of defects arising in dielectric stack structures formed by chemical vapor deposition (CVD). Incidence of a first defect type attributable to reaction between an unreacted species of a prior CVD step and reactants of a subsequent CVD step, is reduced by exposing a freshly-deposited dielectric layer to a plasma before any additional layers are deposited. Incidence of a second defect type attributable to the presence of incompletely vaporized CVD liquid precursor material, is reduced by exposing the freshly-deposited dielectric layer to a plasma, and/or by continuing the flow of carrier gas through an injection valve for a period beyond the conclusion of the CVD step.

6 Claims, 19 Drawing Sheets

U.S. PATENT DOCUMENTS

| | | |
|---|---|---|
| 6,349,887 B1 | 2/2002 | Pyo |
| 6,358,323 B1 | 3/2002 | Schmitt et al. |
| 6,360,685 B1 | 3/2002 | Xia et al. |
| 6,374,770 B1 | 4/2002 | Lee et al. |
| 6,375,753 B1 | 4/2002 | Tolia et al. |
| 6,402,126 B2 | 6/2002 | Vaartstra et al. |
| 6,409,839 B1 | 6/2002 | Sun et al. |
| 6,418,960 B1 | 7/2002 | Mintz et al. |
| 6,432,479 B2 * | 8/2002 | Chang et al. .......... 427/255.394 |
| 6,511,923 B1 | 1/2003 | Wang et al. |
| 6,573,181 B1 * | 6/2003 | Srinivas et al. .............. 438/656 |
| 6,789,789 B2 * | 9/2004 | Randive et al. ............. 261/133 |
| 2002/0000195 A1 | 1/2002 | Bang et al. |
| 2003/0072884 A1 * | 4/2003 | Zhang et al. .......... 427/255.391 |

* cited by examiner

Height : 295 Å          Width:  0.307 µm

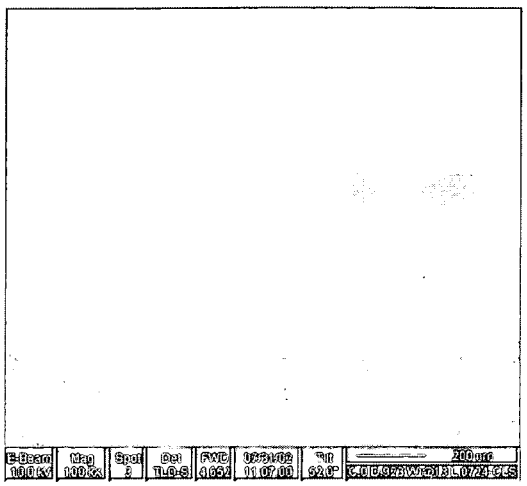
FIG. 9A
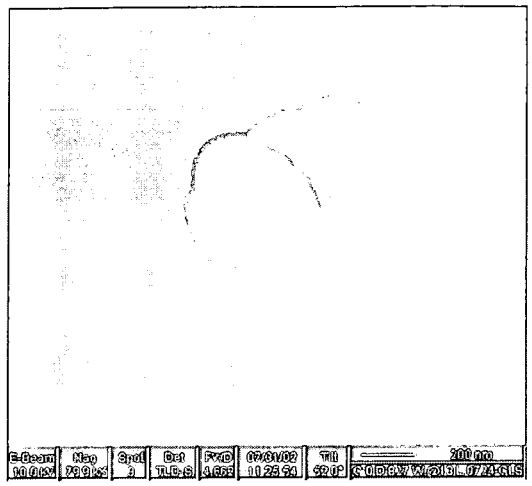
FIG. 9B
FIG. 9C
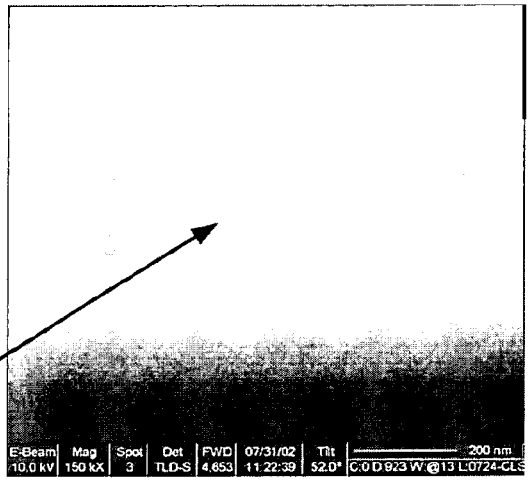
VOID
FIG. 9D
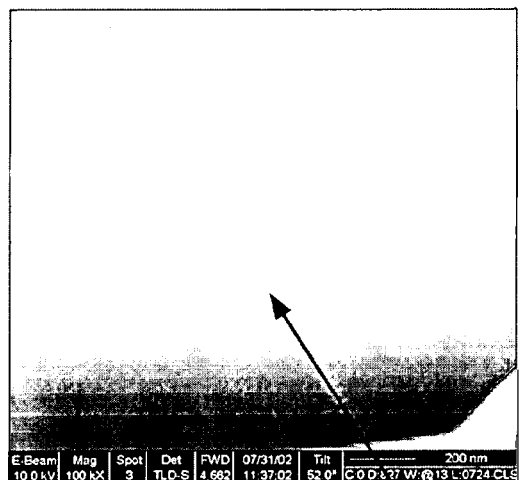
VOID

METHODS AND DEVICES TO REDUCE DEFECTS IN DIELECTRIC STACK STRUCTURES

BACKGROUND OF THE INVENTION

Chemical vapor deposition (CVD) and other processing employed in the fabrication of semiconductor devices may utilize a number of gases or vaporized processing liquids. These gases, which may take the form of vaporized liquid precursors, are generated and supplied to a CVD chamber via a system of pipes or lines and vaporizing mechanisms known as a gas delivery system. Typically a vaporizing mechanism for vaporizing each processing liquid is coupled to a source of processing liquid and to a source of carrier gas. Each vaporizing mechanism and processing liquid source combination within a gas delivery system is referred to as a vaporization stage. Although a number of vaporizing mechanisms exist (e.g., bubblers, injection valves, etc.), most conventional gas delivery systems employ a plurality of injection valves for vaporizing processing liquids to be delivered to a CVD chamber.

A typical injection valve comprises a processing liquid inlet for receiving a pressurized processing liquid, a carrier gas inlet for receiving a pressurized inert carrier gas, and an outlet for delivering a vaporized processing liquid/carrier gas mixture. The injection valve is heated such that when the processing liquid is injected into the carrier gas, the heat and the low partial vapor pressure of the processing liquid in the carrier gas causes the processing liquid to vaporize. A high carrier gas pressure produces more processing liquid vaporization by lowering the partial vapor pressure of the processing liquid within the carrier gas. Accordingly, when designing a gas delivery system, maintenance of adequate carrier gas pressure is an important consideration, as is minimizing overall system size and complexity.

To achieve a low partial vapor pressure for each processing liquid while minimizing system size, conventional gas delivery systems are configured such that a carrier gas is delivered (via a mass flow controller) to a first injection valve, where it is used to vaporize a first processing liquid, forming a first vaporized processing liquid/carrier gas mixture.

While conventional approaches utilizing precursor liquids in the fabrication of semiconductor devices are effective, there is an ongoing need in the art to maintain high throughput and reduce the incidence of defects to as great an extent as possible.

BRIEF SUMMARY OF THE INVENTION

A variety of techniques may be employed, alone or in combination, to reduce the incidence of defects arising in dielectric stack structures formed by chemical vapor deposition (CVD). Incidence of a first defect type attributable to the presence of unreacted species during a CVD step is reduced by exposing a freshly-deposited dielectric layer to a plasma before depositing any additional layers. Incidence of a second defect type attributable to the presence of incompletely vaporized CVD liquid precursor material may also be reduced by exposing the freshly-deposited dielectric layer to a plasma, and/or by continuing the flow of carrier gas through an injection valve for a period of time beyond the conclusion of the CVD step.

An embodiment of a method in accordance with the present invention for reducing the incidence of defects in a stack of dielectric layers formed by chemical vapor deposition, comprises, flowing a liquid precursor material to an injection valve, vaporizing the liquid precursor material in a carrier gas flowed through the injection valve, and causing a reaction involving the vaporized liquid precursor material to deposit a first dielectric layer. The flow of liquid precursor material to the injection valve is halted at a first time, and then the flow of carrier gas to the injection valve is halted at a second time after the first time.

An embodiment of a method in accordance with the present invention for reducing the incidence of defects in a stack of dielectric layers, comprises, depositing a first dielectric layer by chemical vapor deposition, and exposing the freshly deposited dielectric layer to a plasma generated in a reactive gas to remove from a surface of the freshly deposited dielectric layer at least one of an incompletely vaporized liquid precursor material and an incompletely reacted material. A second dielectric layer is deposited over the first dielectric layer following exposure of the freshly deposited first dielectric layer to the plasma.

An embodiment of a substrate processing apparatus in accordance with the present invention comprises a processing chamber and a gas distribution system including an injection valve in fluid communication with a liquid precursor source and in fluid communication with a carrier gas source, the injection valve configured to deliver a flow of liquid precursor vaporized in the carrier gas to the processing chamber. An RF power system is configured to apply RF energy to generate a plasma in a gas in fluid communication with the processing chamber. A controller configured to control the gas delivery system and the RF power system. A memory is coupled to the controller, the memory comprising a computer-readable medium having a computer-readable program embodied therein for directing operation of the substrate processing apparatus. The computer-readable program includes (i) a first set of instructions for halting a flow of the liquid precursor material to the injection valve at the conclusion of a deposition step involving the vaporized liquid precursor material, and (ii) a second set of instructions for causing the RF power system to introduce the plasma into the processing chamber after the flow of liquid precursor to the injection valve has been halted.

An alternative embodiment of a substrate processing apparatus in accordance with the present invention comprises a processing chamber, and a gas distribution system including an injection valve in fluid communication with a liquid precursor source and in fluid communication with a carrier gas source, the injection valve configured to deliver a flow of liquid precursor vaporized in the carrier gas to the processing chamber. A controller is configured to control the gas delivery system. A memory is coupled to the controller, the memory comprising a computer-readable medium having a computer-readable program embodied therein for directing operation of the substrate processing apparatus. The computer-readable program includes (i) a first set of instructions for halting a flow of the liquid precursor material to the injection valve at the conclusion of a deposition step involving the vaporized liquid precursor material, and (ii) a second set of instructions for halting a flow of the carrier gas material to the injection valve after the flow of liquid precursor material to the injection valve has been halted.

A further understanding of the objects and advantages of the present invention can be made by way of reference to the ensuing detailed description taken in conjunction with the accompanying drawings.

BRIEF DESCRIPTION OF THE DRAWINGS

FIGS. 9A and 9C show electron microscopy images of plan and cross-sectional views respectively, of a defect of the second type.

FIGS. 9B and 9D show electron microscopy images of plan and cross-sectional views respectively, of another defect of the second type.

DETAILED DESCRIPTION OF THE INVENTION

I. Defect Reduction

Figure 5:
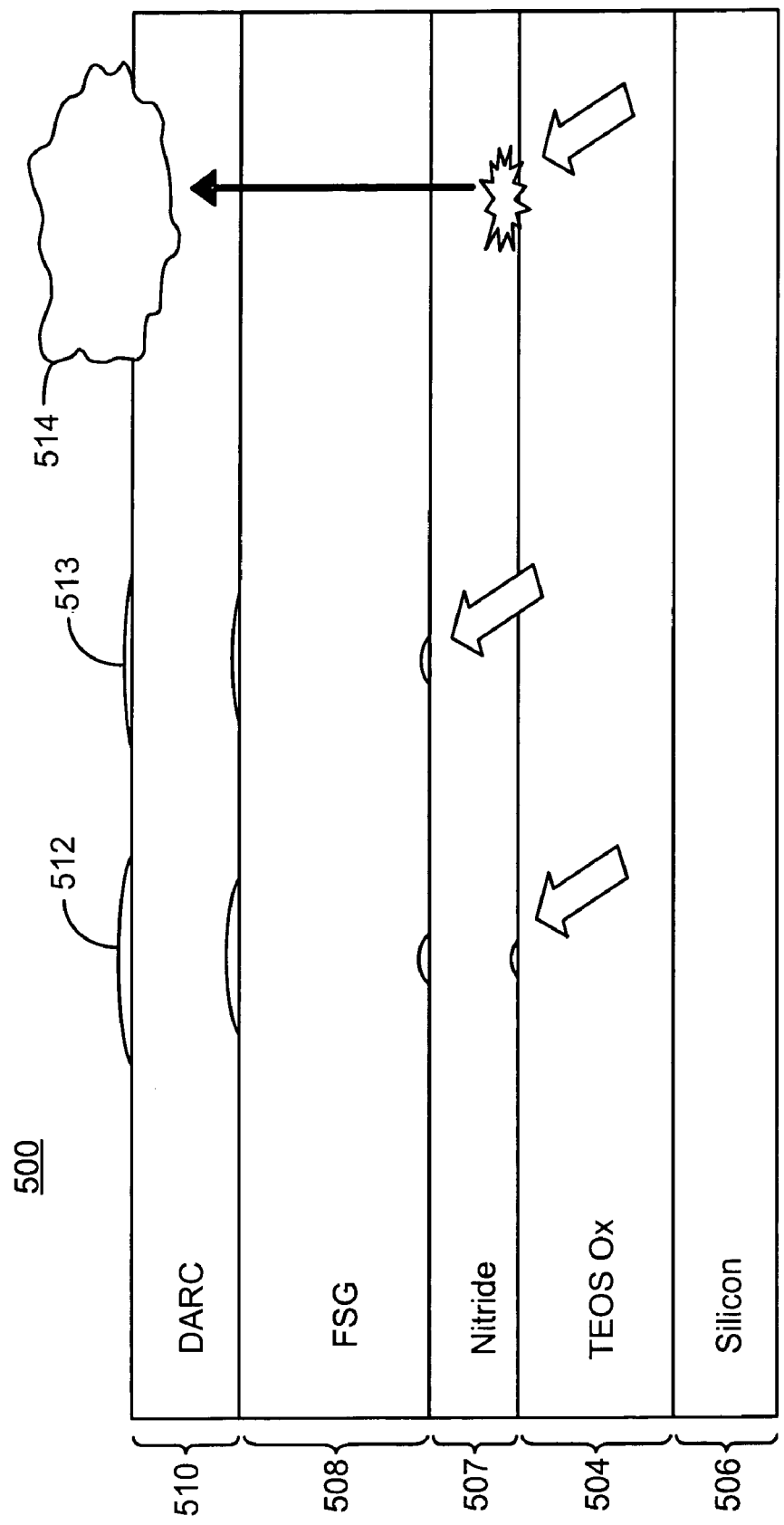
FIG. 5 shows a simplified cross-sectional sketch of a dielectric stack including defects of the first and second type.

FIG. 5 shows a simplified cross-sectional sketch of a stack of dielectric layers that may be formed during the fabrication of a semiconductor device. Dielectric stack 500 comprises silicon oxide layer 504 having a thickness of about 10,000 Å that is formed over silicon 506. Silicon oxide layer 504 may typically be formed by chemical vapor deposition involving the reaction of tetraethyl orthosilicate (TEOS). TEOS is a liquid at room temperature, and is typically introduced into a deposition chamber by vaporization of the liquid precursor material in a carrier gas.

Silicon nitride layer 507 having a thickness of about 300 Å is next deposited over the silicon oxide layer 504. Fluorinated silicate glass (FSG) layer 508 having a thickness of about 2,500 Å is then formed over nitride layer 507. Finally, dielectric anti-reflective coating (DARC®) 510 having a thickness of about 600 Å is deposited over the FSG layer 508 to complete the dielectric stack 500.

Figure 6:
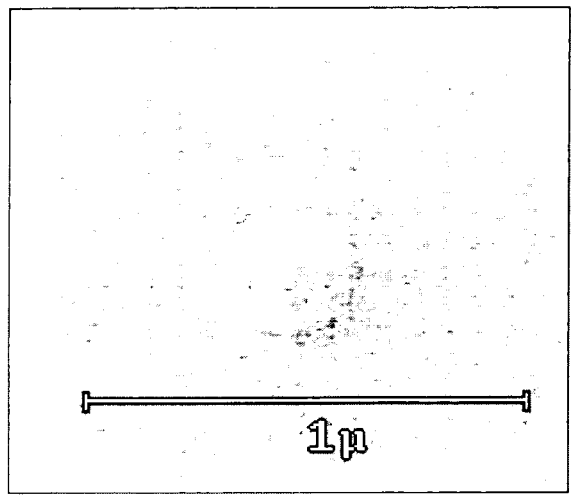
FIG. 6 shows an electron microscopy image of a plan view of a defect of the first type.
Figure 7:
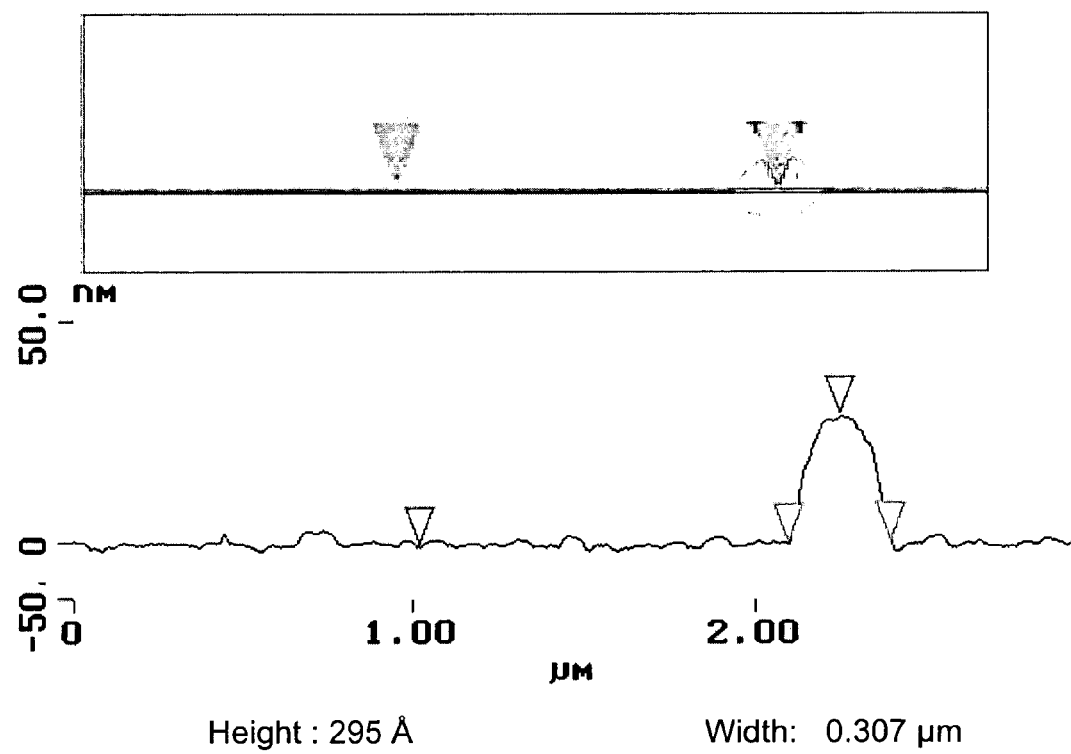
FIG. 7 shows the results of atomic force microscopy analysis of a defect of the first type.

FIG. 5 graphically illustrates the occurrence of two different types of defects during fabrication of the dielectric stack. A first defect type 512 exhibits a relatively short vertical profile and occurs with relatively high frequency. FIG. 6 is an electron micrograph of plan view of DARC layer 510 showing a defect of the first type. FIG. 7 shows results of atomic force microscopy of a defect of the first type.

The mechanism of formation of defects of the first type may involve the presence of incompletely reacted species on the surface of a deposited layer. For example, defect 512 in FIG. 5 may result from the presence of dangling Si bonds present on the surface of silicon oxide layer 504 of the dielectric stack 500. Defect 513 in FIG. 5 may result from the presence of dangling Si bonds present on the surface of silicon nitride layer 507 of the dielectric stack 500.

During subsequent deposition to form overlying layers in the stack, these incompletely reacted materials may serve as nucleation sites for unwanted reactions with reactants of subsequent CVD steps. Moreover, because reaction of less than 100% of the available materials is not uncommon, defects of the first type occur with relatively high frequency over the surface of the deposited layer.

FIG. 5 also graphically illustrates the occurrence of second defect type 514 in dielectric stack 500. Second defect type 514 is generally larger than the first defect type, and occurs with significantly lower frequency than defects of the first type. Second defect type 514 is attributable to the presence of incompletely vaporized CVD liquid precursor reactant on the surface of a deposited layer. Such non-vaporized residue in turn reacts with, and may be coated by, reactants in subsequent CVD processes.

Figure 8A:
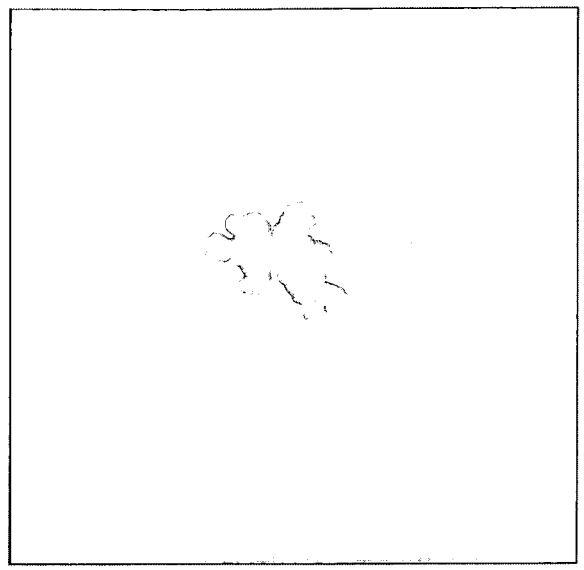
FIG. 8A shows an electron microscopy image of a plan view of a defect of the second type following deposition of a first type of an overlying layer.
Figure 8B:
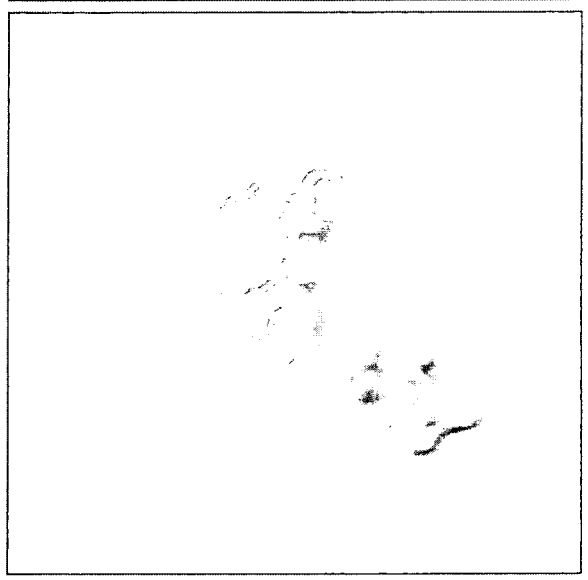
FIG. 8B shows an electron microscopy image of a plan view of a defect of the second type following deposition of a second type of an overlying layer.
Figure 8C:
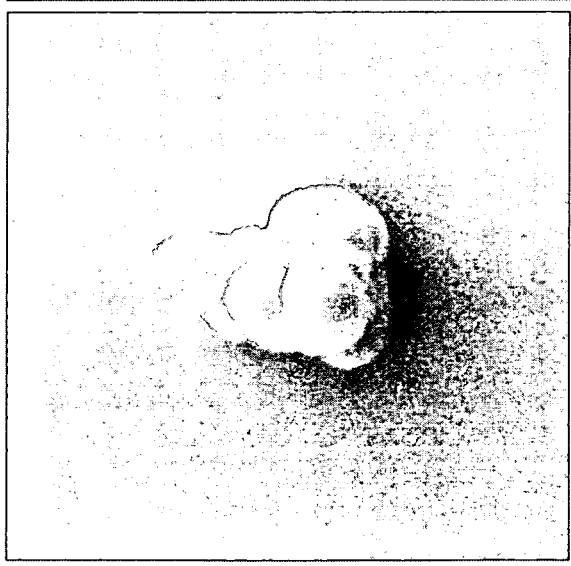
FIG. 8C shows an electron microscopy image of a plan view of a defect of the second type following deposition of a third type of an overlying layer.

The mechanism of formation for defects of the second type is evidenced by FIGS. 8A-C, which show electron microscopy images of plan views of a surface wherein the following layers, respectively, have been deposited over a silicon oxide layer: 300 Å SiN (FIG. 8A), 700 Å BLOk dielectric (FIG.

8B), and 3400 Å FSG (FIG. 8C). Each of the defects shown in FIGS. 8A-C exhibit an irregular, boulder-like appearance commonly associated with a reaction site bearing an overcoating of material from a subsequent deposition.

The mechanism of formation of defects of the second type is further evidenced by FIGS. 9A-D. FIGS. 9A and 9B show scanning electron microscopy images of plan views of two dielectric stacks bearing defects of the second type. FIGS. 9C and 9D show electron microscopy images of the defects of FIGS. 9C and 9D, following fluorine ion bombardment (FIB). FIGS. 9C and 9D reveal the presence of a void underlying the defects, a phenomena also suggestive of a reaction-type defect which blocks exposure of the underlying material to CVD reactants.

Defects of either the first type or the second type are undesirable during processing of semiconductor wafers. Defects of the second type may be large enough to alter the physical structure of a dielectric stack, thereby compromising performance of active electronic devices incorporating the stack. Defects of the first type are not generally large enough to disrupt the electronic physical or electrical character of active electronic devices fabricated from a dielectric stack. However, defects of the first type do occur in large numbers, overwhelming detection apparatuses and interfering with detection of less common but larger and more significant defects, for example those of the second type.

In accordance with embodiments of the present invention, various techniques may be employed to reduce the incidence of defects in dielectric stack structures formed by CVD. The frequency of occurrence of defects of the first type may be reduced by exposing a freshly-deposited dielectric layer to plasma before depositing any additional layers. The frequency of occurrence of defects of the second type may also be reduced by exposing the freshly-deposited dielectric layer to a plasma. Alternatively or in conjunction with a post-deposition plasma exposure step, defects of the second type may be reduced by maintaining flow of carrier gas through an injection valve for a period of time following the conclusion of a CVD step, thereby ensuring complete vaporization of liquid precursor CVD material.

A. Post-Deposition Plasma Treatment

In accordance with one embodiment of the present invention, the incidence of defects of either the first type or the second type may be reduced by exposing a freshly deposited dielectric layer to a plasma. This post-deposition plasma reacts with and consumes unreacted or incompletely vaporized materials remaining on the surface of the deposited layer. As a result, these materials are not available to interact with subsequent CVD materials to nucleate or otherwise create a defect in a subsequently deposited layer.

In certain instances, deposition of a layer of the dielectric stack may result from other than a plasma-assisted CVD process, such as thermal CVD or low pressure CVD (LPCVD). In such an approach, after deposition a plasma may be introduced into the processing chamber to remove material present on the surface of the freshly-deposited layer. Such a post-deposition plasma may be generated within the deposition chamber itself, or may be generated remotely and then flowed into the deposition chamber. Alternatively, the wafer bearing the freshly-deposited layer could be transferred to a second chamber for the post-deposition plasma exposure.

In other instances, deposition of a layer of the dielectric stack may result from a plasma-assisted CVD process such as plasma enhanced CVD (PECVD) or high density plasma CVD (HDPCVD). In such an approach, the plasma utilized during deposition may be maintained after deposition of the dielectric layer has been completed. Such a post-deposition plasma could be created from the same mixture of gases utilized during deposition, or could be created from a different mixture of gases, for example the reactant gases minus a silicon-containing reactant gas.

Figure 10:
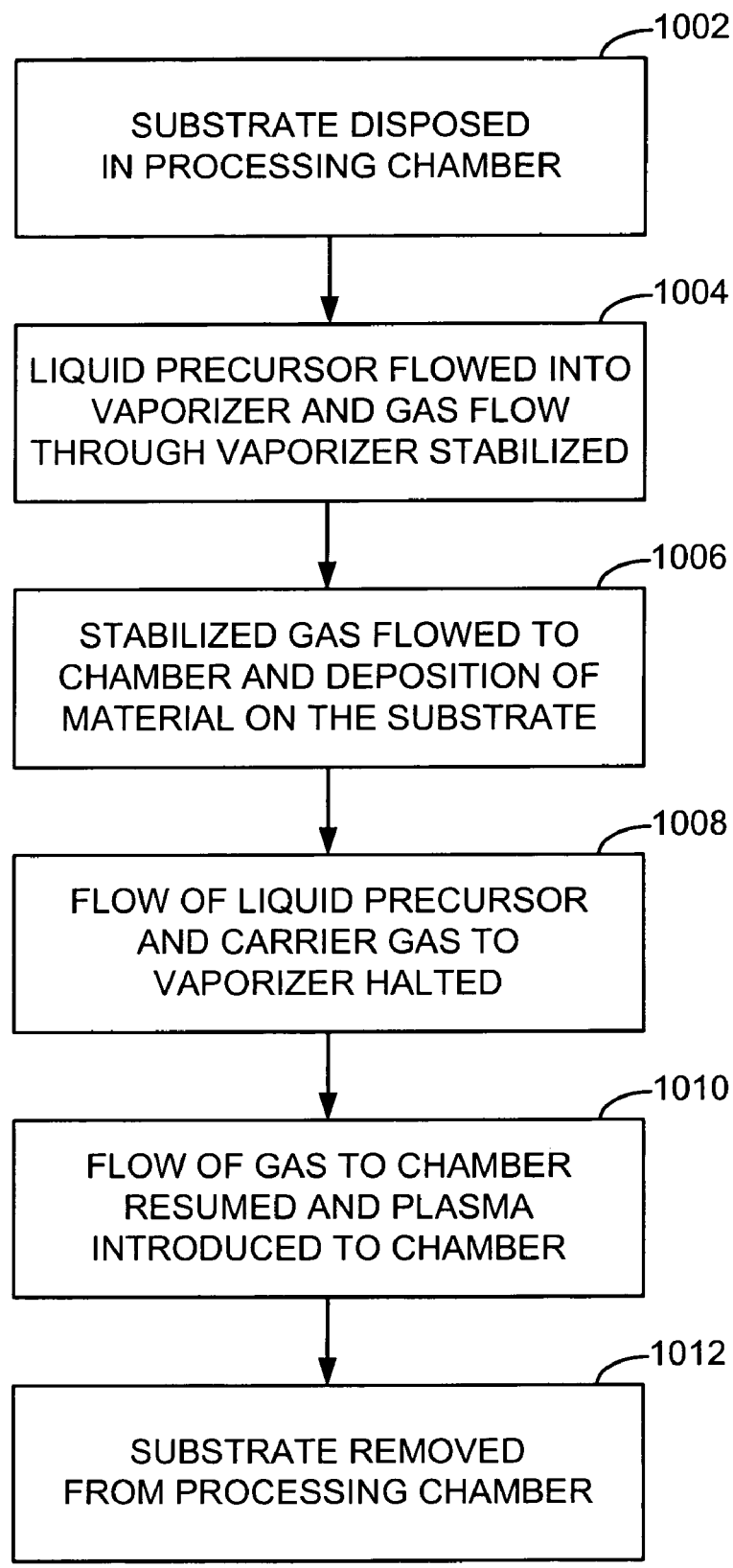
FIG. 10 is a simplified flow chart depicting method steps in accordance with one embodiment of the present invention.

FIG. 10 is a simplified flow chart depicting method steps in accordance with one embodiment of the present invention for reducing defects in a processed semiconductor substrate. In step 1002, a substrate is disposed within a processing chamber. In step 1004, liquid precursor is flowed to an injection valve and a flow of gas through the injection valve is stabilized.

In step 1006, the stabilized gas flow is conveyed to the processing chamber to effect deposition of material on the substrate. Examples of carrier gases flowed into the chamber during this step include but are not limited to helium, argon, and nitrogen. Examples of reactive gases flowed into the chamber during this step include but are not limited to $O_2$, $N_2O$, and $NH_3$.

At the conclusion of this deposition process, in step 1008 the flow of a liquid precursor to the vaporizer, and the flow of carrier gas through the vaporizer, may be halted at the same time.

In step 1010, the flow of gas to the processing chamber is resumed, and a plasma is introduced into the chamber. The gases flowed into the chamber during this post deposition plasma treatment step may include some or all of the reactive gases flowed during the deposition step, alone or in conjunction with a flow of carrier gas. In certain embodiments, the rate of flow of the silicon containing reactive gas may be reduced by 75% or more or halted entirely.

This post-deposition plasma may be generated directly in the processing chamber in situ, or may be remotely generated and then flowed into the chamber. The plasma within the processing chamber reacts with and removes unreacted or incompletely vaporized materials remaining on the surface of the deposited layer.

In step 1012, the plasma is extinguished and the processed substrate is removed from the chamber to allow for additional fabrication steps to take place.

TABLE 1 summarizes the state of different parameters during the various steps of the process shown in FIG. 10.

TABLE 1

| STEP NO. | LIQUID PRECURSOR FLOW | CARRIER GAS FLOW | PLASMA GENERATOR | REACTIVE GAS FLOW |
| --- | --- | --- | --- | --- |
| 1002 | OFF | OFF | OFF | OFF |
| 1004 | ON | ON | OFF | ON |
| 1006 | ON | ON | ON | ON |
| 1008 | OFF | OFF | OFF | OFF |
| 1010 | OFF | ON or OFF | ON | ON |
| 1012 | OFF | OFF | OFF | OFF |

Figure 11:
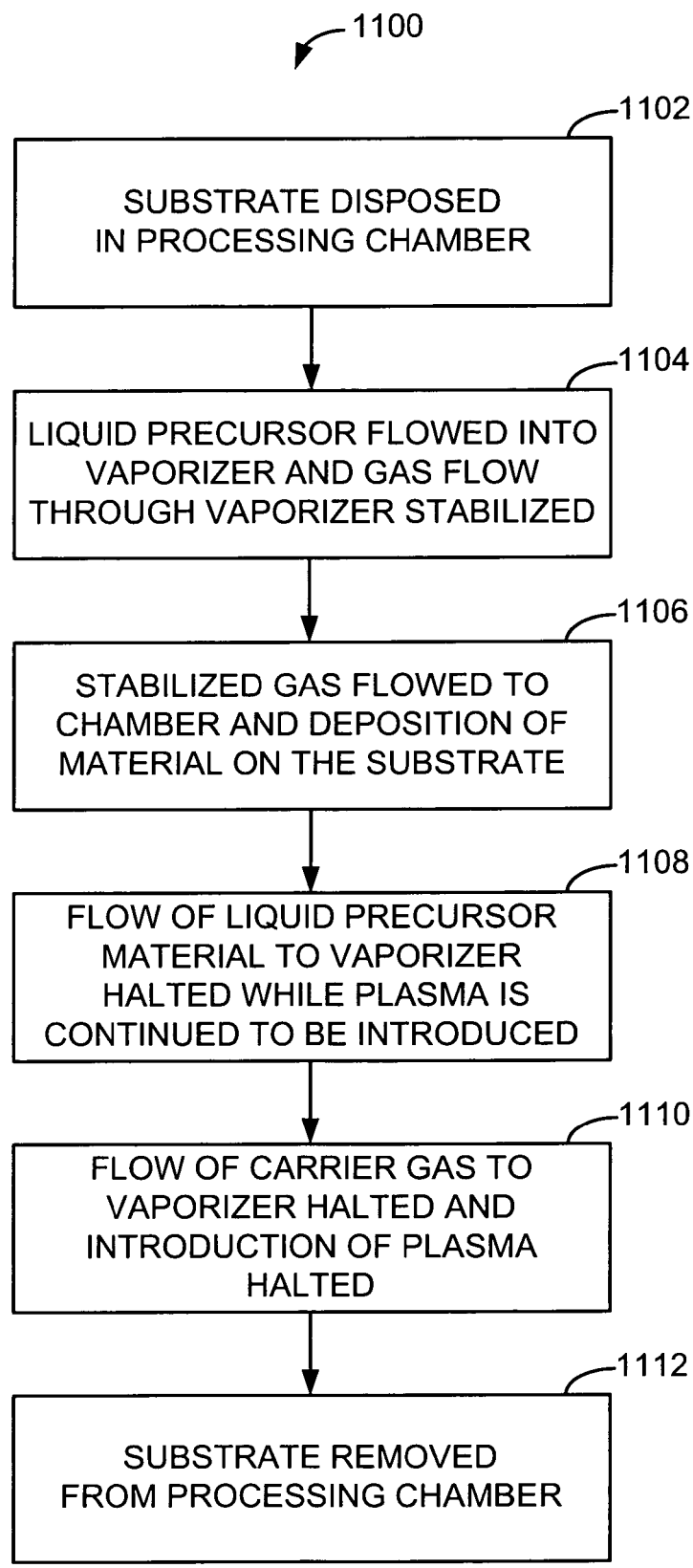
FIG. 11 is a simplified flow chart depicting method steps in accordance with an alternative embodiment of the present invention.

The post-deposition plasma treatment just described need not require a separate step, but may instead be readily integrated into an existing plasma exposed step with resulting high throughput. FIG. 11 shows a simplified flow chart depicting method steps of such an embodiment.

In first step 1102 of method 1100, a substrate is disposed within a processing chamber. In step 1104, liquid precursor is flowed to an injection valve and a flow of gas through the injection valve is stabilized.

In step 1106 the stabilized gas flow is conveyed to the processing chamber and a plasma is introduced thereto to effect a plasma-assisted chemical vapor deposition of material on the substrate. At the conclusion of this deposition process, in step 1108 the flow of liquid precursor to the vaporizer is halted but the plasma continues to be introduced to the chamber, thereby completing reaction of any unreacted species remaining on the film that has just been deposited.

In step 1110, the introduction of plasma into the chamber is halted, and the flow of carrier gas into chamber is also halted. In step 1112, the substrate is removed from the processing chamber.

TABLE 2 summarizes the state of different parameters during the various steps of the process shown in FIG. 11.

TABLE 2

| STEP NO. | LIQUID PRECURSOR FLOW | CARRIER GAS FLOW | PLASMA GENERATOR | REACTIVE GAS FLOW |
|---|---|---|---|---|
| 1102 | OFF | OFF | OFF | OFF |
| 1104 | ON | ON | OFF | OFF |
| 1106 | ON | ON | ON | ON |
| 1108 | OFF | ON | ON | ON |
| 1110 | OFF | OFF | OFF | OFF |

The plasma utilized in such a post-deposition treatment need not be maintained continuously within the processing chamber after deposition. In alternative embodiments, the post-deposition plasma treatment could be non-continuous, such that the plasma is halted at the end of the deposition process and then subsequently resumed in order to remove residual unreacted or incompletely vaporized material.

And while the specific example described in connection with FIGS. 10 and 11 illustrate a deposition process utilizing a vaporized liquid precursor as a reactant gas, this is not required by the present invention. A post-deposition plasma treatment step in accordance with embodiments of the present invention may also be utilized to reduce the incidence of defects of the first type resulting from incomplete reaction of gaseous CVD reactants not produced by vaporization of original liquid precursor materials.

B. Prolonged Carrier Gas Flow

As described above, defects of the second type may occur due to the presence of incompletely vaporized CVD liquid precursor reactant material on the surface of a deposited layer. Such incompletely vaporized liquid precursor material can be removed through post-deposition plasma treatment in the manner described above.

However, the incidence of defects of the second type may also be reduced by preventing incompletely vaporized liquid precursor material from forming on the wafer surface in the first place. Specifically, CVD liquid precursor reactants are generally introduced into the processing chamber by vaporization in a flow of a pressurized carrier gas. If the carrier gas flow is insufficient to carry precursor material into the deposition chamber in gas form, the vapor can recombine in the chamber to form a liquid droplet.

Conventionally, at the conclusion of CVD processes involving TEOS or other vaporized liquid precursors, the flow of all gases (including carrier gases) is halted at the same time. Where however, any amount of liquid precursor is flowed to an injection valve after the carrier gas flow has been halted, some amount of non-vaporized liquid TEOS may be injected directly into the chamber. It is this incompletely vaporized liquid precursor material which can subsequently react to create a defect of the second type.

Therefore, in accordance with alternative embodiments of the present invention, methods and apparatuses ensure that at the conclusion of a CVD process involving vaporized liquid precursors, the flow of carrier gas to a vaporizer continues for some period beyond the halting of flow of liquid precursor to the injection valve. This sequence of events ensures that any residual liquid precursor material remaining in the injection valve or in the flow lines is absorbed by the continuing flow of carrier gas, such that the precursor material enters the processing chamber in vapor rather than liquid form.

Figure 12:
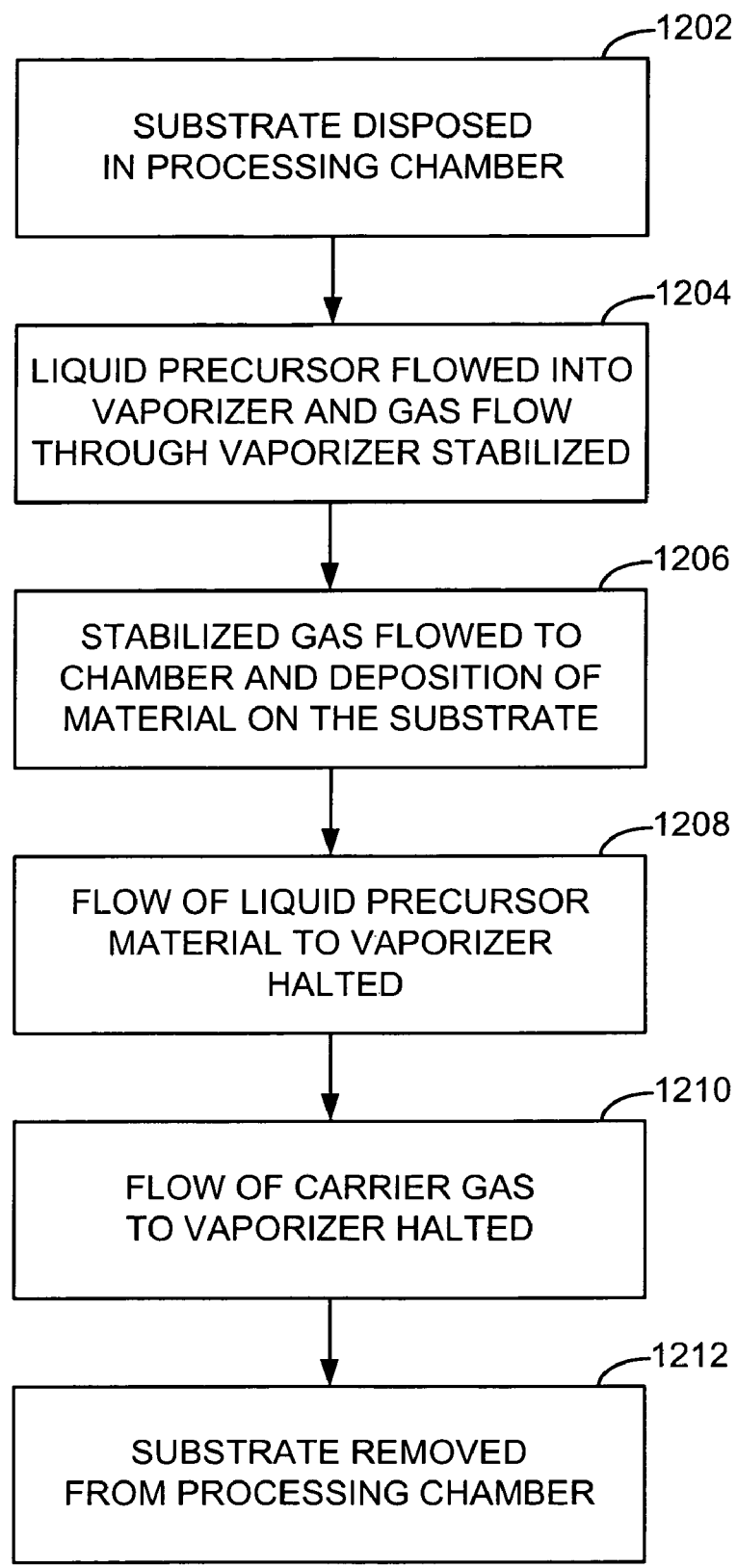
FIG. 12 is a simplified flow chart depicting method steps in accordance with another alternative embodiment of the present invention.

FIG. 12 is a simplified flow chart depicting method steps in accordance with an such an alternative embodiment of the present invention. In step 1202, a substrate is disposed within a processing chamber.

In step 1204, liquid precursor and carrier gas are flowed to an injection valve and the resulting gas flow is stabilized. In step 1206, the stabilized gas flow is conveyed to the processing chamber to effect deposition of material on the substrate. At the conclusion of this deposition process, in step 1208 the flow of a liquid precursor to the vaporizer is halted, with the flow of carrier gas through the vaporizer maintained. During this step, any residual liquid precursor material within the injection valve is vaporized to prevent its being flowed in liquid form to the processing chamber.

In step 1210, the flow of carrier gas through the injection valve to the processing chamber is halted. In step 1212, the processed wafer is removed from the chamber for further processing.

TABLE 3 summarizes the state of different parameters during the various steps of the process shown in FIG. 12.

TABLE 3

| STEP NO. | LIQUID PRECURSOR FLOW | CARRIER GAS FLOW | PLASMA GENERATOR | REACTIVE GAS FLOW |
|---|---|---|---|---|
| 1202 | OFF | OFF | OFF | OFF |
| 1204 | ON | ON | OFF | ON |
| 1206 | ON | ON | ON | ON |
| 1208 | OFF | ON | OFF | ON or OFF |
| 1210 | OFF | OFF | OFF | OFF |

Various techniques may be employed alone or in combination to avoid introducing incompletely vaporized liquid precursor material into the processing chamber. One such approach utilizes a software recipe or subroutine to delay shutting off the carrier stream for a short period of time, typically 1-10 seconds, after the flow of liquid precursor has been halted. As discussed below in detail in connection with FIG. 1C, the tool processor typically includes a process gas control subroutine which governs operation of components delivering gases to the processing chamber. This process gas control subroutine could include commands allowing the carrier gas flow to be stopped only after a minimum time from halt of flow of liquid precursor to the injection valve.

Alternatively or in conjunction with the software approach described above, the apparatus of the gas delivery system could include a hardware configuration which automatically shuts off of the carrier gas stream for a short period, typically 1-10 seconds, after the flow of the liquid precursor to the vaporization stage has been halted.

Such a hardware-implemented delay could be based upon the physical operation of a valve positioned between the mass flow controller of the carrier gas and the injection valve. Alternatively, such a hardware-implemented delay could be based upon the physical operation of the mass flow controller of the carrier gas itself, for example by the use of a capacitance based hardware delay switch.

C. Experimental Results

Figure 13:
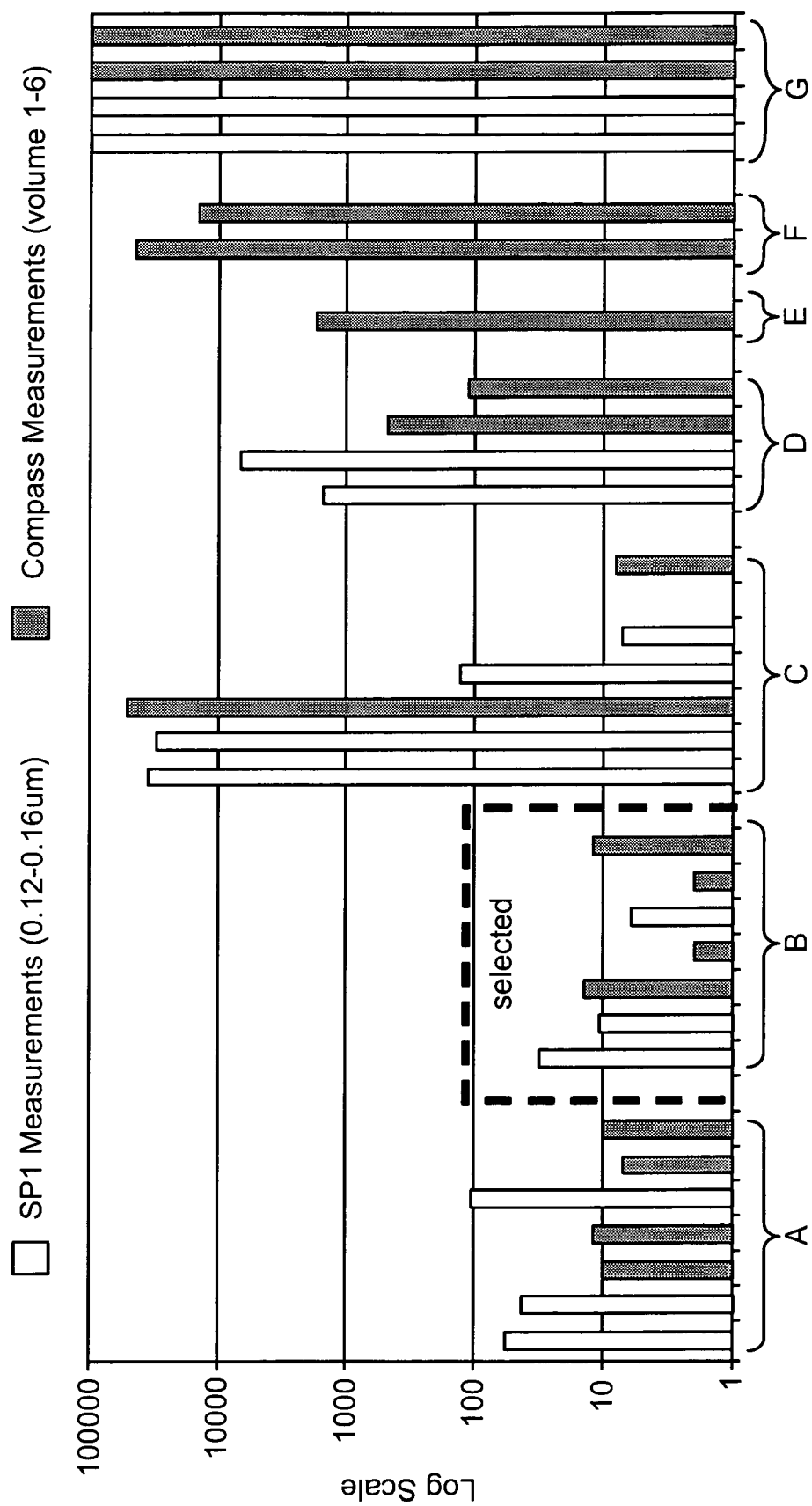
FIG. 13 plots detected defects on a logarithmic scale for a plurality of different processed wafers.

FIG. 13 plots detected defects of the first type on a logarithmic scale for processed wafers bearing a dielectric stack comprising a 7800 Å-thick layer of fluorosilicate glass (FSG) deposited over a 300Å-thick layer of CVD silicon nitride (SiN). The freshly deposited silicon nitride layer of the various lots of processed wafers were exposed to plasma for three seconds under the conditions summarized below in TABLE 4:

TABLE 4

| LOT | SILANE (SiH$_4$) FLOW RATE DURING POST-DEPOSITION PLASMA TREATMENT OF SiN LAYER (sccm) | AMMONIA (NH$_3$) FLOW RATE DURING POST-DEPOSITION PLASMA TREATMENT OF SiN LAYER (sccm) |
|---|---|---|
| A | 55 | 75 |
| B | 5 | 75 |
| C | 0 | 75 |
| D | 55 | 0 |
| E | 5 | 0 |
| F | 0 | 0 |
| G | 210 | 75 |

RATE OF FLOW OF NITROGEN (N$_2$) DURING ALL LOTS = 5000 sccm

FIG. 13 plots the rate of incidence of defects of the first type as detected by two different apparatuses. One tool utilized to detect defects of the first type is the SP1 tool manufactured by KLA-Tencor Corp. of San Jose, Calif. A second tool utilized to detect defects of the second type is the COMPASS® tool manufactured by Applied Materials Inc. of Santa Clara.

FIG. 13 shows the data for several different continuous plasma termination conditions. Lot G represents the case of no termination and uses the conventional deposition gas flow conditions for the three additional seconds of plasma exposure. The results of lots A and B show that by greatly reducing the silane concentration during the three second continuous plasma termination (compared to the standard case lot G), the incidence of defects is greatly reduced (by >99%). Without wishing to be bound by any particular theory, lower a silane concentration may lead to more complete reaction in the nitride, leaving less unreacted species on the material surface.

Wafers exposed to no silane in the termination step (lot C), would be expected to show the lowest defect counts. However, those results were inconsistent. This inconsistency was later attributed to operational characteristics of the Applied Materials Producer valve sequencing software and hardware. Where a Silane MFC is set to zero, the MFC may actually continue to flow an unpredictable amount of silane for several seconds. Not withstanding the nuances of the Applied Materials Producer valve sequencing software, the theoretical best practice is to halt silane flow completely during the continuous plasma termination step.

Lots D, E, and F show the defect reduction to be minimal if the NH$_3$ is also turned off during the termination. This is because the NH$_3$ is necessary in the termination plasma to complete the reaction on any dangling silicon bonds.

Figure 14:
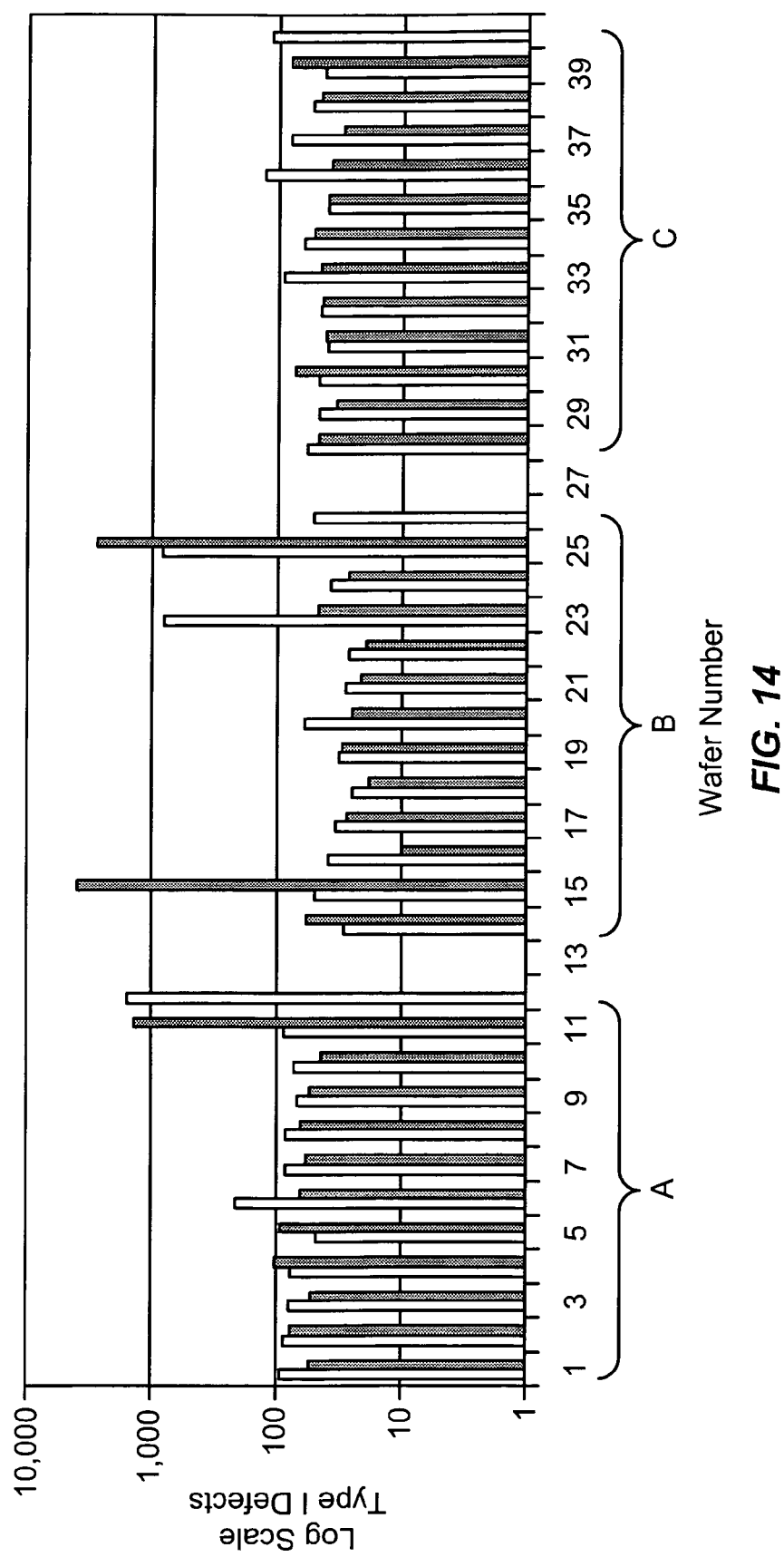
FIG. 14 plots detected defects on a logarithmic scale for three different lots of processed wafers.

FIG. 14 shows that the duration of the post-deposition plasma exposure can affect the incidence of defects of the first type. FIG. 14 plots detected defects on a logarithmic scale for three different lots of twelve wafer pairs processed in a dual chamber tool. First and second lots A and B comprise wafers bearing the dielectric stack of FIG. 5, wherein the surface of the freshly deposited silicon oxide layer was exposed to plasma for five seconds after the deposition process, and the freshly deposited silicon nitride layer was exposed to plasma for three seconds after the deposition process. Third lot C comprises wafers bearing the dielectric stack of FIG. 5, wherein the surface of the freshly deposited oxide layer was exposed to plasma for ten seconds beyond the end of the deposition process, and the freshly deposited nitride layer was exposed to plasma for five seconds beyond the end of the deposition process.

FIG. 14 shows that in first lot A, two wafers (the wafer processed in the second chamber of pair 11, and the wafer processed in the first chamber of pair 12) experienced a large number (>1000) of defects. In second lot B, four wafers (the wafer processed in the second chamber of pair 15, the wafer processed in the first chamber of pair 23, and the wafers processed in the first and second chambers of pair 25) experienced a large number (~1000 or higher) of defects. By contrast, in third lot C where the wafers were treated more extensively with plasma, none of the wafers exhibited such a large number of defects. FIG. 13 thus shows that the duration of post deposition plasma treatment may correlate with the resulting number of defects detected.

Figure 15A:
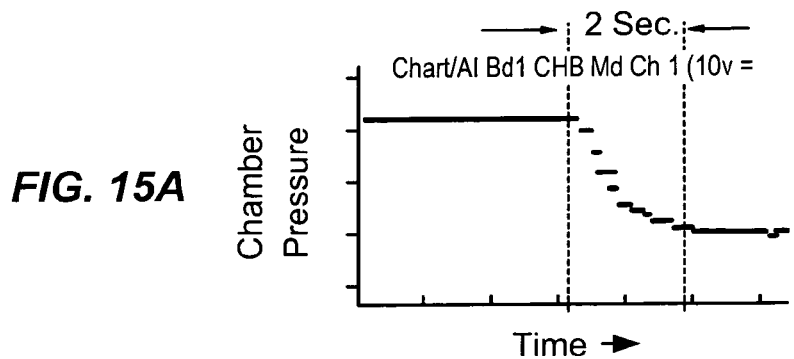
FIG. 15A plots chamber pressure versus time at the conclusion of a nitride deposition step utilizing silane.
Figure 15B:
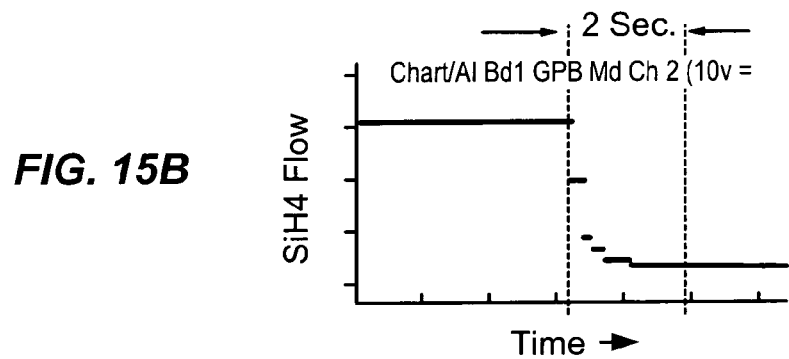
FIG. 15B plots silane flow versus time at the conclusion of the nitride deposition step shown in FIG. 15A.
Figure 15C:
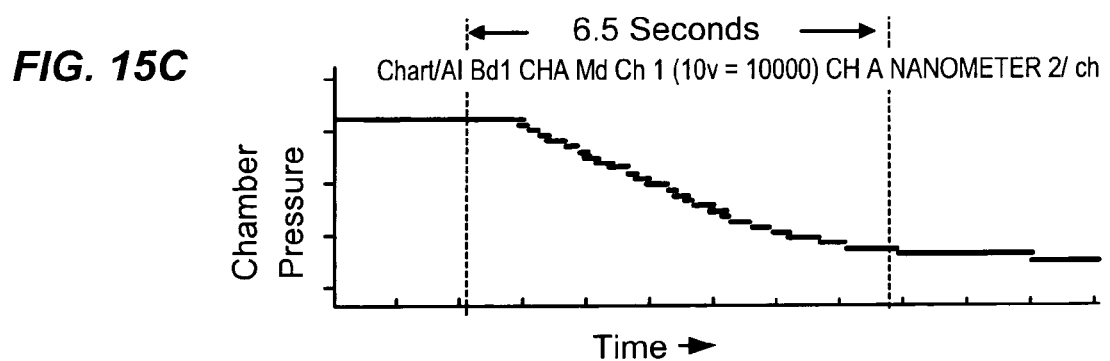
FIG. 15C plots chamber pressure versus time at the conclusion of an oxide deposition step utilizing TEOS.
Figure 15D:
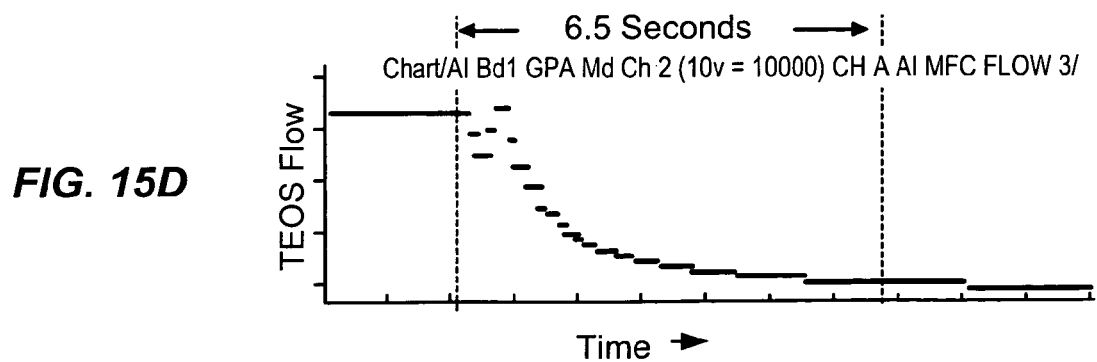
FIG. 15D plots TEOS flow versus time at the conclusion of the oxide deposition step shown in FIG. 15C.

The beneficial effect of prolonged treatment to a post-deposition plasma may be related the characteristic flow of different materials flowed into the chamber. For example, FIG. 15A plots chamber pressure versus time at the conclusion of a nitride deposition step utilizing silane as a CVD reactant. FIG. 15B plots silane flow versus time at the conclusion of the nitride deposition step shown in FIG. 15A. FIG. 15C plots chamber pressure versus time at the conclusion of a CVD step deposition step utilizing vaporized TEOS as a CVD reactant. FIG. 15D plots TEOS flow versus time at the conclusion of the oxide deposition step shown in FIG. 15C. Comparison of FIGS. 15A-B with FIGS. 15C-D shows that vaporized TEOS material exhibits a substantially longer response time than vaporized silane, such that vaporized TEOS will continue to flow into the chamber for a period after the flow of TEOS has been instructed to be halted. This difference in response time would indicate longer post-deposition plasma exposure to remove the additional TEOS present within the chamber.

Figure 16:
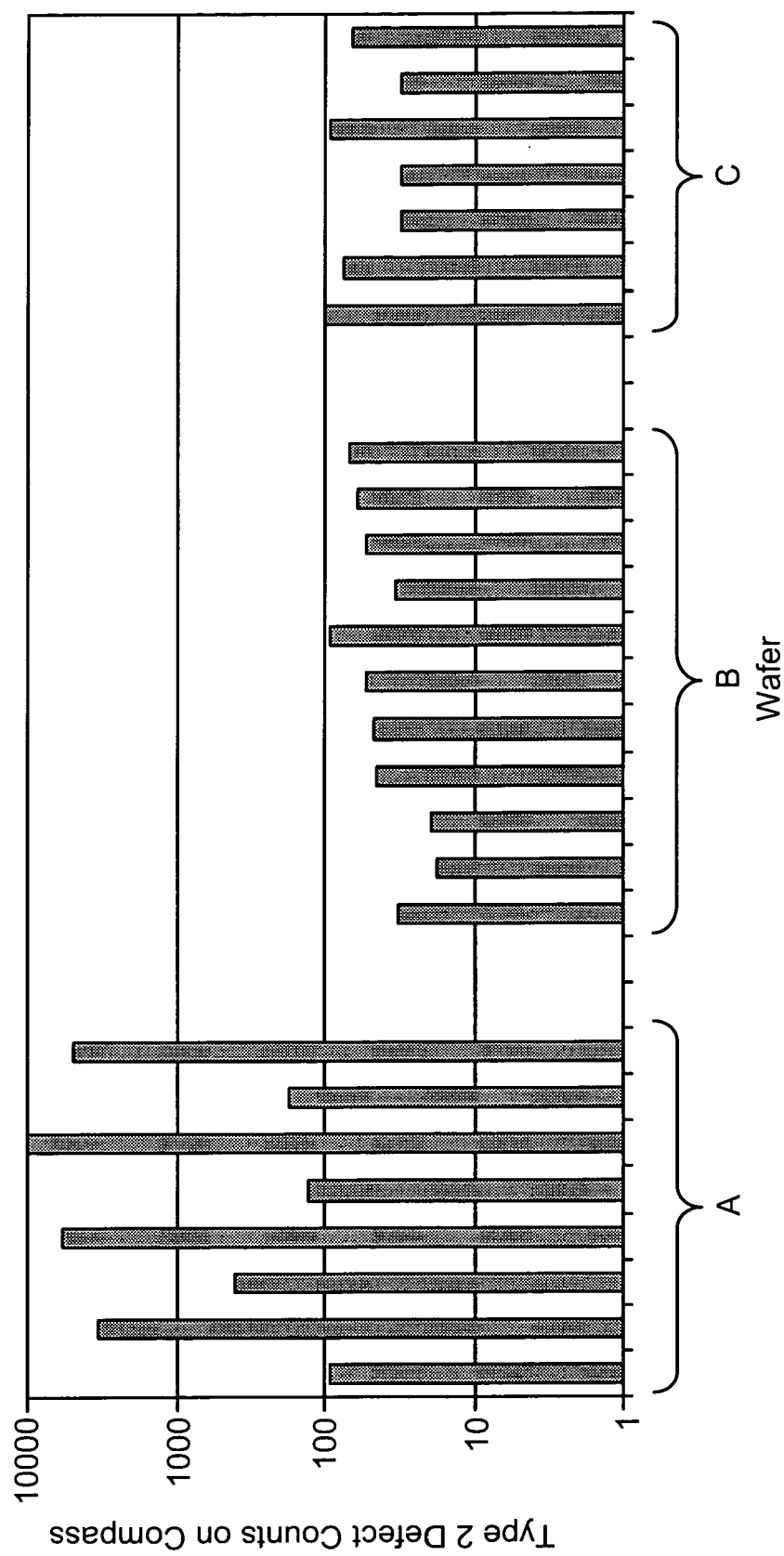
FIG. 16 plots the number of defects of the second type for a plurality of different processed wafers.

FIG. 16 shows that a post-deposition plasma exposure step may also be utilized to reduce the incidence of defects of the second type. FIG. 16 plots detected defects of the second type on a logarithmic scale for three different lots of processed wafers bearing the dielectric stack of FIG. 5. The wafers of first lot A include a conventionally deposited silicon oxide layer. The wafers of second lot B include a silicon oxide layer that was exposed to plasma following deposition. The wafers of third lot C include a silicon oxide layer that was deposited utilizing a flow of carrier gas continuing beyond the end of flow of liquid precursor to the injection valve, without any post-deposition plasma treatment. FIG. 16 shows that a rate of incidence of defects of the second type at about 100 or higher for all of the conventionally processed wafers in the first lot. However, for wafers of the second and third lots processed in accordance with embodiments of the present invention, the rate of incidence of defects of the second type was substantially lower (i.e. 100 or less). FIG. 16 thus shows either the post-deposition plasma treatment or continued carrier gas flow approaches is effective to reduce the incidence of defects of the second type.

Figure 17A:
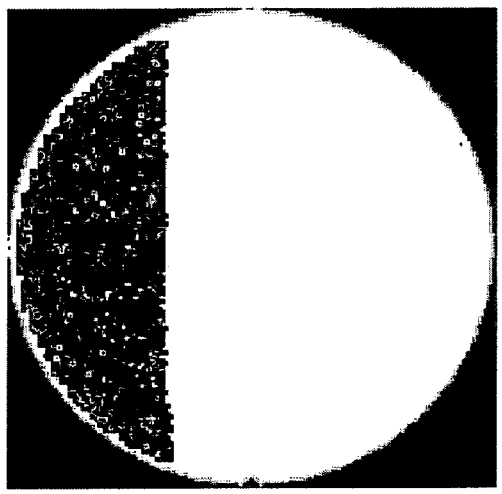
FIG. 17A shows the results of a defect detection analysis of a first wafer processed without a post-deposition plasma treatment step.
Figure 17C:
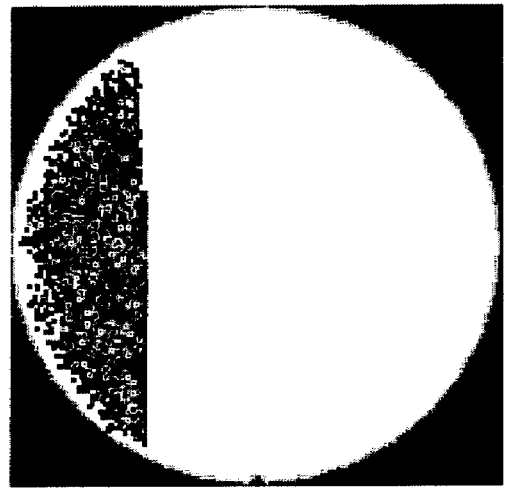
FIG. 17C shows the results of a defect detection analysis of a second wafer processed without a post-deposition plasma treatment step.

This result is confirmed by FIGS. 17A-D, which show the results of utilizing a post-deposition plasma treatment on a processed wafer bearing the dielectric stack of FIG. 5. FIGS. 17A and 17C show defects detected for two different wafers processed with a continuing flow of carrier gas at the end of deposition, but lacking any post-deposition plasma treatment following deposition of silicon oxide. The wafers of both FIGS. 17A and 17C exhibit over 10,000 defects, many of which are of the more frequently first type.

Figure 17B:
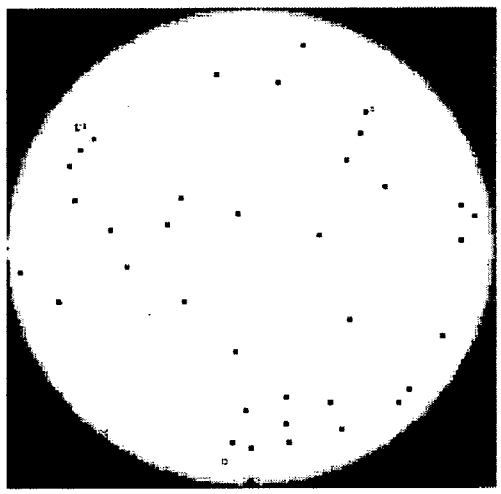
FIG. 17B shows the results of a defect detection analysis of a wafer processed in the same manner as the wafer of FIG. 17A, but including a post-deposition plasma treatment step.
Figure 17D:
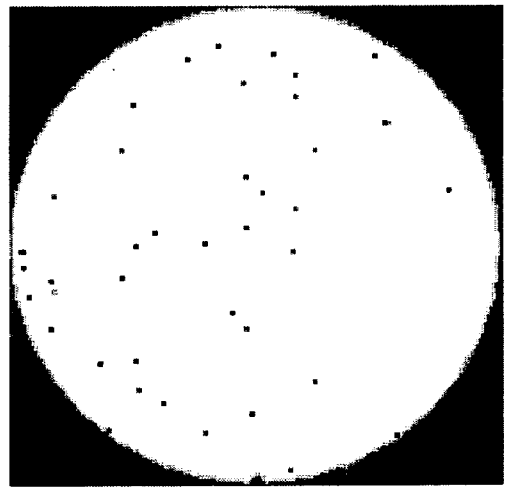
FIG. 17D shows the results of a defect detection analysis of a wafer processed in the same manner as the wafer of FIG. 17C, but including a post-deposition plasma treatment step.

FIGS. 17B and 17D show defects detected for two different wafers which did not include a continuing flow of carrier gas at the conclusion of deposition, but which did receive the post-deposition plasma treatment following silicon oxide deposition. The wafers of both FIGS. 17B and 17D exhibit dramatically fewer detected defects (45 defects in FIG. 17B, and 43 defects in FIG. 17D) as compared with the wafers of FIGS. 17A and 17B. The defect detection shown in FIGS. 17A-17D was performed utilizing a compass tool manufactured by Applied Materials, Inc. of Santa Clara, Calif., having a defect sensitivity of about 0.16 μm.

II. Exemplary Deposition System

Figure 1A:
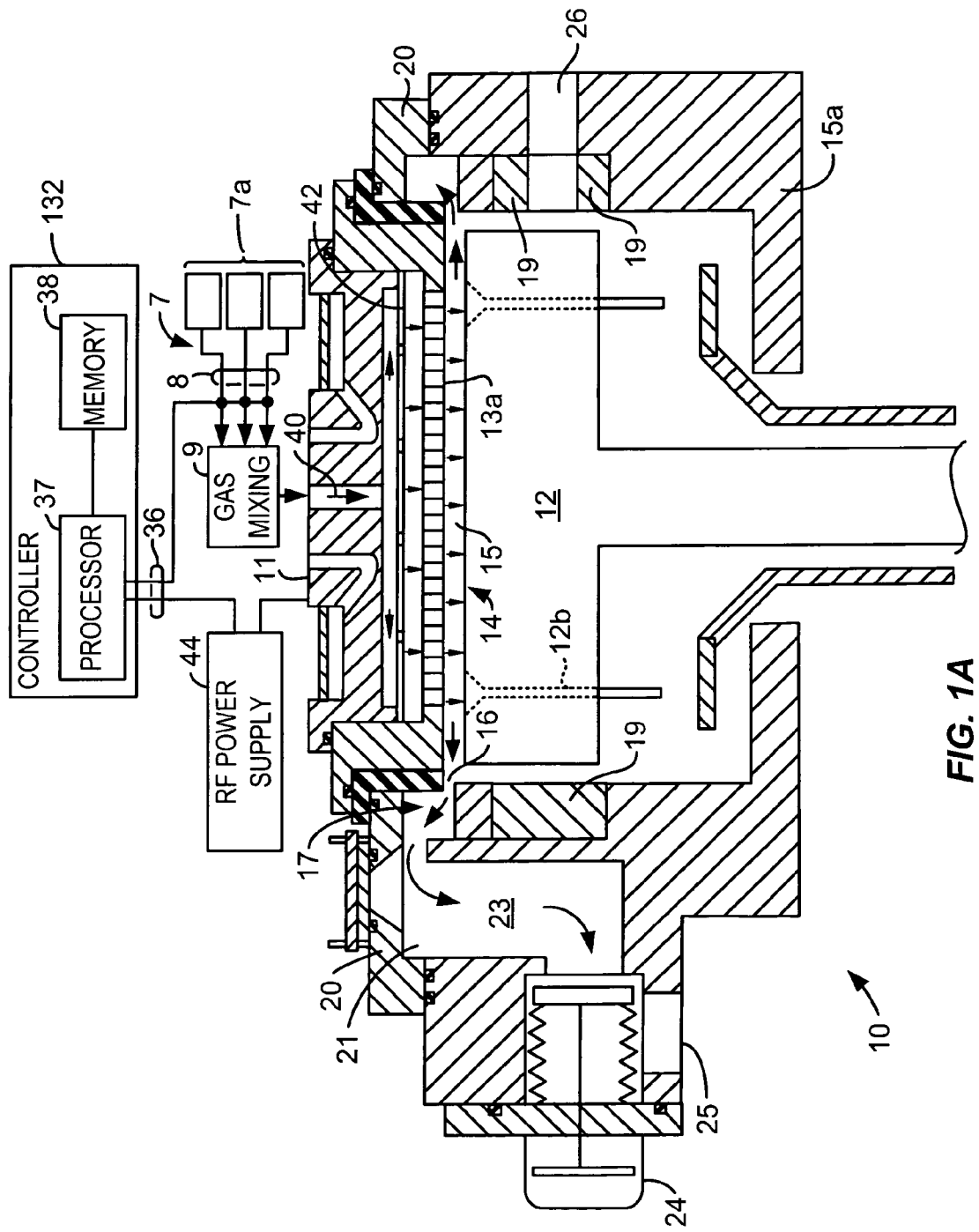
FIG. 1A is a vertical, cross-sectional view of one embodiment of a chemical vapor deposition apparatus according to the present invention.
Figure 1B:
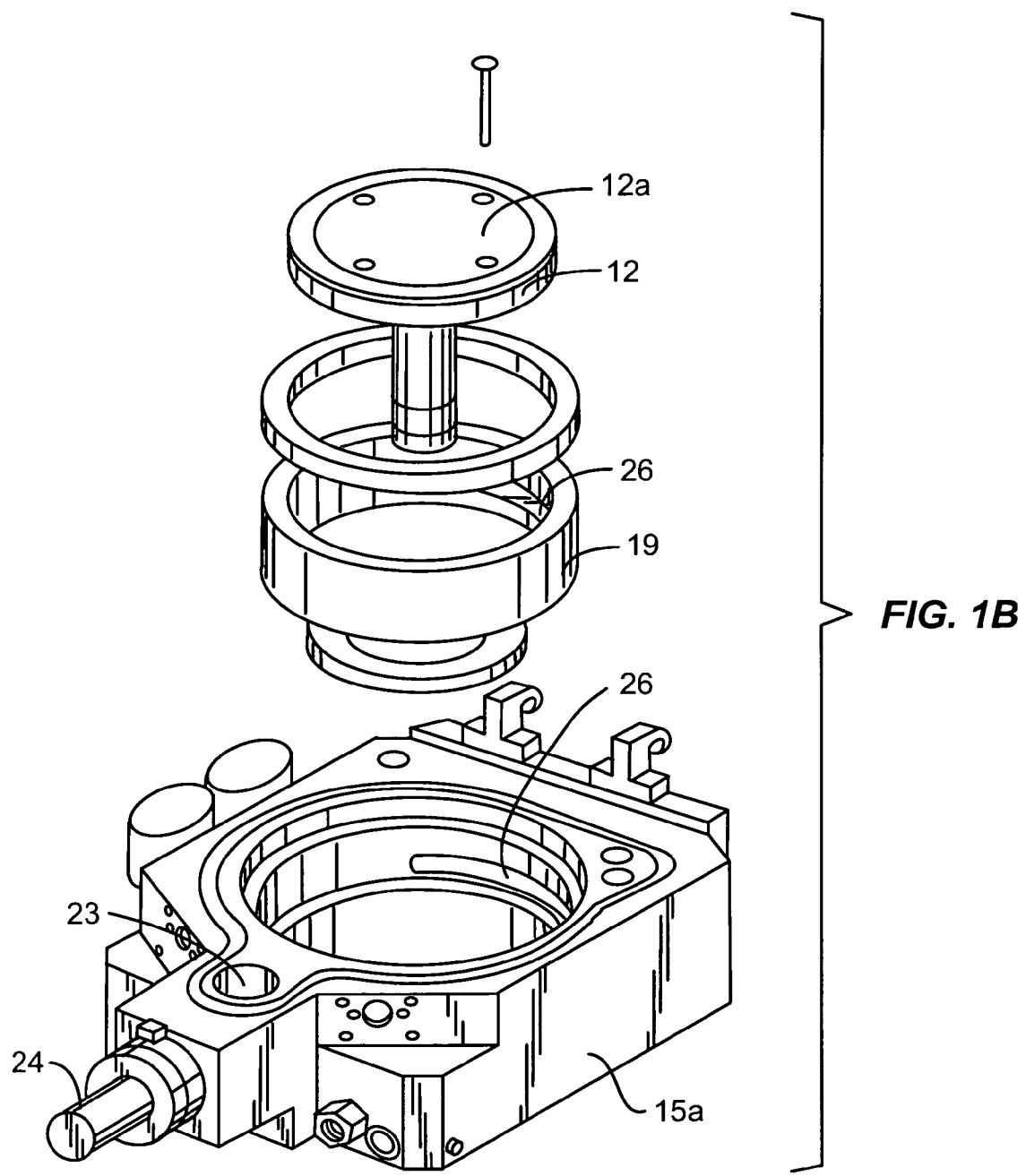
FIGS. 1B and 1C are exploded perspective views of parts of the CVD chamber depicted in FIG. 1A.
Figure 1C:
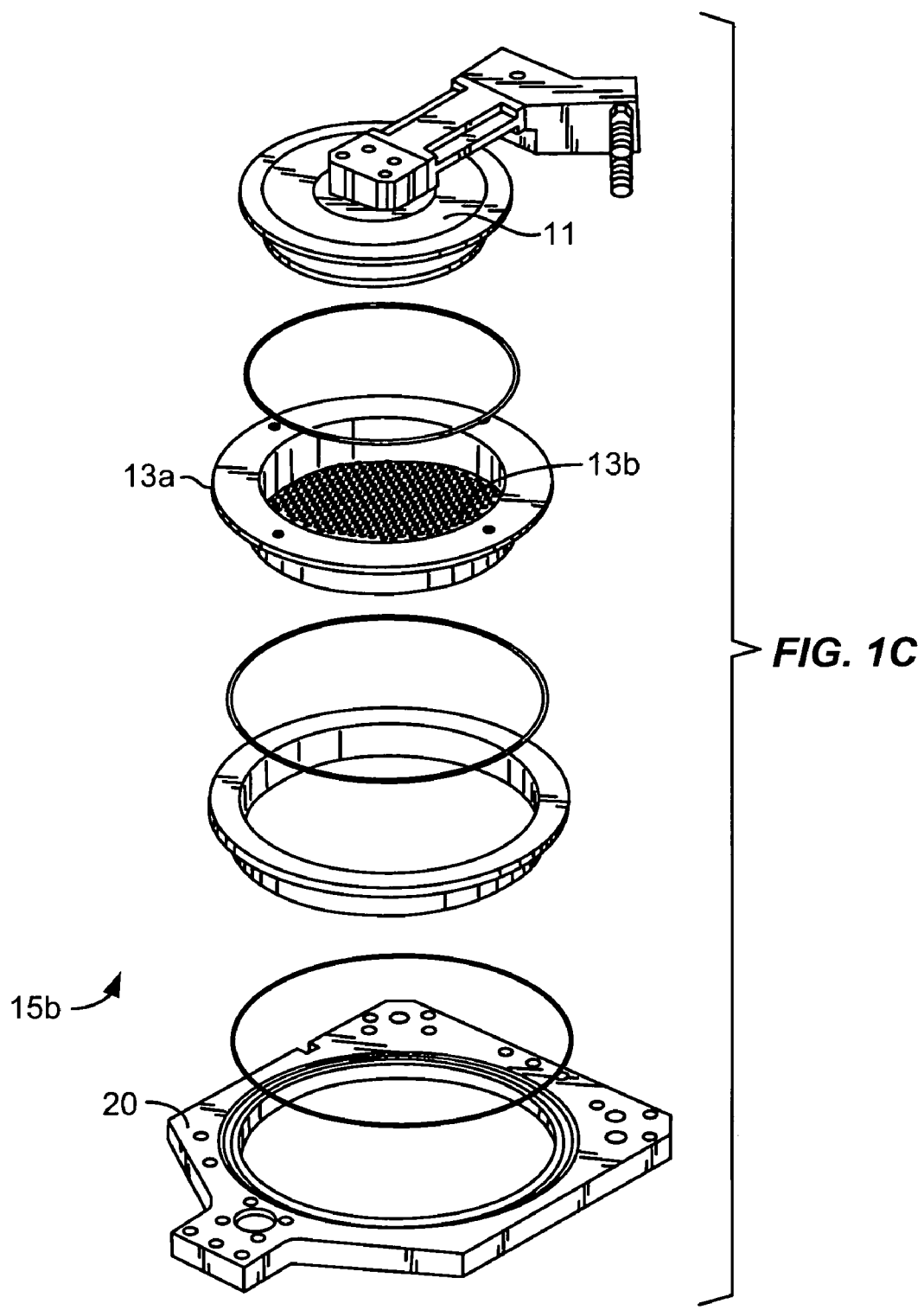

One suitable CVD apparatus in which the method of the present invention can be carried out is shown in FIG. 1A, which are vertical, cross-sectional views of a CVD system 10, having a vacuum or processing chamber 15 that includes a chamber wall 15a and chamber lid assembly 15b. Chamber wall 15a and chamber lid assembly 15b are shown in exploded, perspective views in FIGS. 1B and 1C.

CVD system 10 contains a gas distribution manifold 11 for dispersing process gases to a substrate (not shown) that rests on a heated pedestal 12 centered within the process chamber. During processing, the substrate (e.g. a semiconductor wafer) is positioned on a flat (or slightly convex) surface 12a of pedestal 12. The pedestal can be moved controllably between a lower loading/off-loading position (not shown) and an upper processing position (shown in FIG. 1A), which is closely adjacent to manifold 11. A centerboard (not shown) includes sensors for providing information on the position of the wafers.

Deposition and carrier gases are introduced into chamber 15 through perforated holes 13b (FIG. 1C) of a conventional flat, circular gas distribution or faceplate 13a. More specifically, deposition process gases flow into the chamber through the inlet manifold 11 (indicated by arrow 40 in FIG. 1A), through a conventional perforated blocker plate 42 and then through holes 13b in gas distribution faceplate 13a.

Before reaching the manifold, deposition and carrier gases are input from gas sources 7a through gas supply lines 8 of gas delivery system 7 (FIG. 1A) into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases (for example, ozone or halogenated gas) are used in the process, the several safety shut-off valves are positioned on each gas supply line in conventional configurations.

The deposition process performed in CVD system 10 can be either a thermal process or a plasma-enhanced process. In a plasma-enhanced process, an RF power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency ($RF_1$) of 13.56 MHz and at a low RF frequency ($RF_2$) of 360 KHz to enhance the decomposition of reactive species introduced into the vacuum chamber 15. In a thermal process, RF power supply 44 would not be utilized, and the process gas mixture thermally reacts to deposit the desired films on the surface of the semiconductor wafer supported on pedestal 12, which is resistively heated to provide thermal energy for the reaction.

During a plasma-enhanced deposition process, the plasma heats the entire process chamber 10, including the walls of the chamber body 15a surrounding the exhaust passageway 23 and the shut-off valve 24. When the plasma is not turned on or during a thermal deposition process, a hot liquid is circulated through the walls 15a of the process chamber to maintain the chamber at an elevated temperature. Fluids used to heat the chamber walls 15a include the typical fluid types, i.e., water-based ethylene glycol or oil-based thermal transfer fluids. This heating beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively-heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No. 5,558,717 is assigned to Applied Materials, Inc., the assignee of the present invention, and is hereby incorporated by reference.

A lift mechanism and motor (not shown) raises and lowers the heated pedestal assembly 12 and its wafer lift pins 12b as wafers are transferred into and out of the body of the chamber by a robot blade (not shown) through an insertion/removal opening 26 in the side of the chamber 10. The motor raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller 132 (FIG. 1A) over control lines 36, of which only some are shown. Controller 132 relies on feedback from optical sensors to determine the position of movable mechanical assemblies such as the throttle valve and susceptor which are moved by appropriate motors under the control of controller 132.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 132 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

Figure 1D:
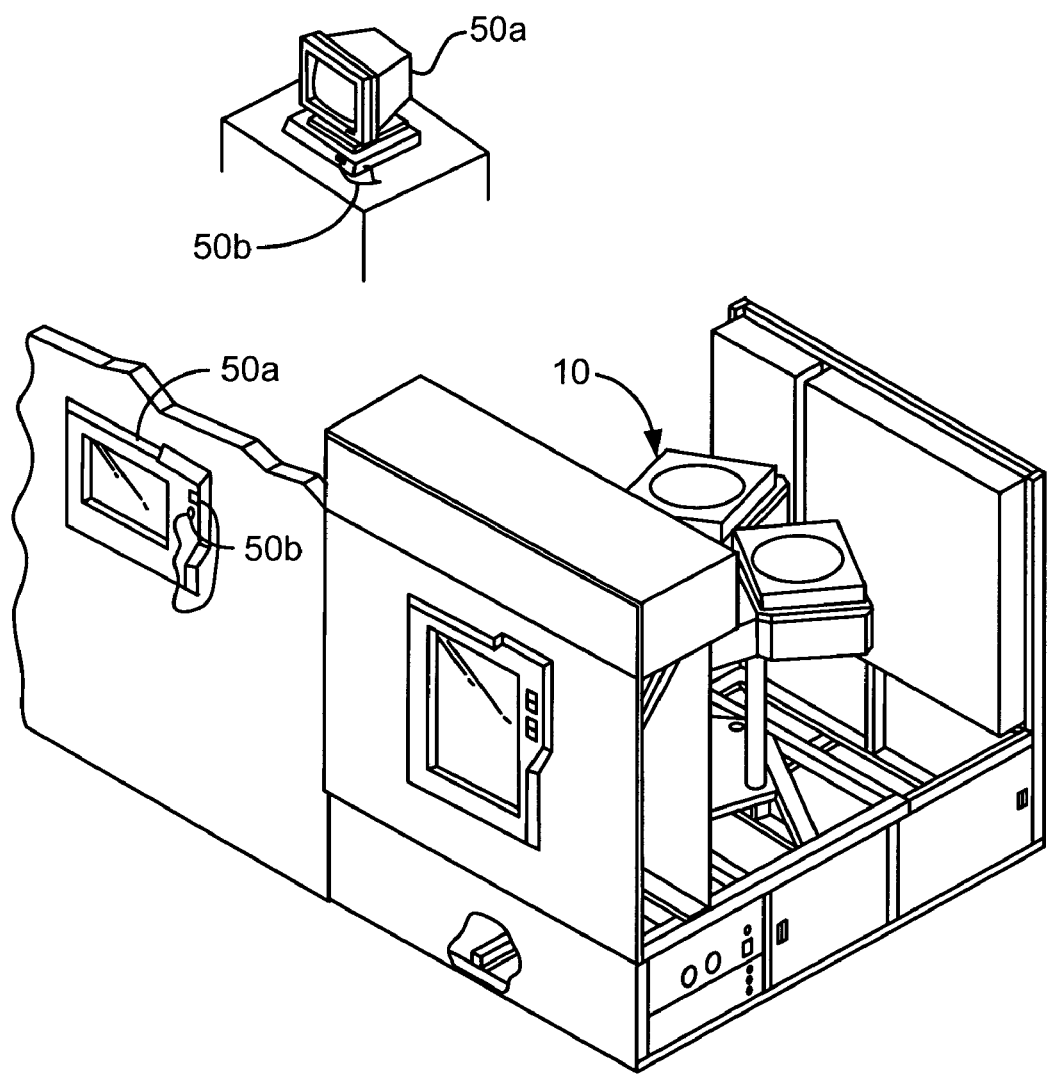
FIG. 1D is a simplified diagram of system monitor and CVD system in a multichamber system, which may include one or more chambers.

The interface between a user and controller 132 is via a CRT monitor 50a and light pen 50b, shown in FIG. 1D, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 132.

The process for depositing the film can be implemented using a computer program product that is executed by controller 132. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

Figure 1E:
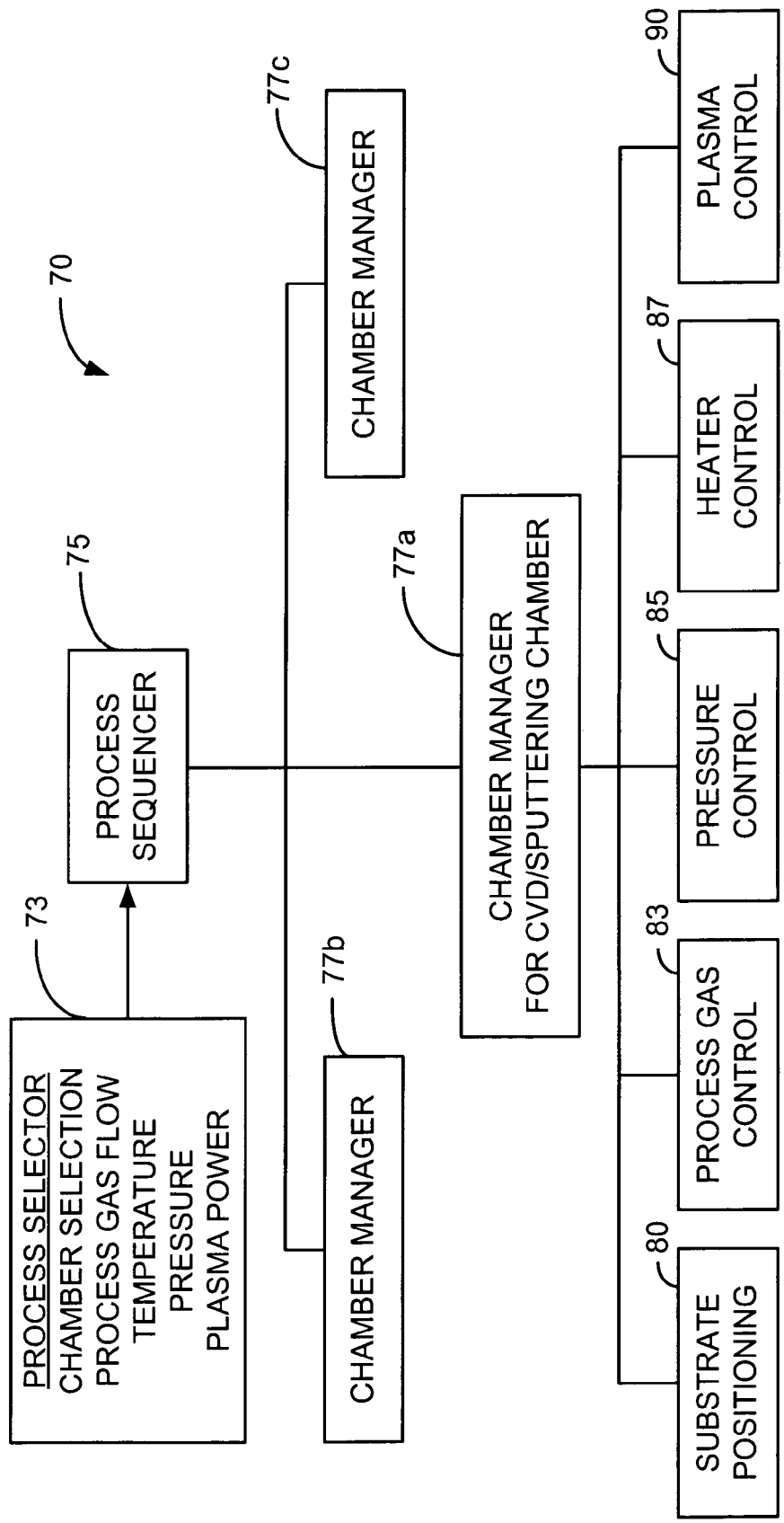
FIG. 1E shows an illustrative block diagram of the hierarchical control structure of the system control software, computer program, according to a specific embodiment.

FIG. 1E is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and are entered utilizing the light pen/CRT monitor interface.

The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a-c, which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art will readily recognize that other chamber control subroutines can be included depending on what processes are to be performed in the process chamber 15. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 15 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1E. The substrate positioning subroutine 80 comprises program code for controlling chamber components that are used to load the substrate onto pedestal 12 and, optionally, to lift the substrate to a desired height in the chamber 15 to control the spacing between the substrate and the gas distribution manifold 11. When a substrate is loaded into the process chamber 15, pedestal 12 is lowered to receive the substrate, and thereafter, the susceptor 12 is raised to the desired height in the chamber, to maintain the substrate at a first distance or spacing from the gas distribution manifold during the CVD process. In operation, the substrate positioning subroutine 80 controls movement of pedestal 12 in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 15 to stabilize the pressure in the chamber before reactive process gases are introduced. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, for example, TEOS, the process gas control subroutine 83 is written to include steps for bubbling a delivery gas, such as helium, through the liquid precursor in a bubbler assembly or introducing a carrier gas, such as helium or nitrogen, to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

As discussed above, in certain embodiments in accordance with the present invention, the process gas control subroutine may purposefully include a delay between the time that the flow of liquid precursor to the injection valve is halted, and the time that a flow of carrier gas to the injection valve is halted. This delay may assist in vaporizing residual liquid precursor, thereby preventing droplets from forming on the surface of the deposited layer. Desired process gas flow rates may be transferred to process gas control subroutine 83 as process parameters.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 operates to measure the pressure in the chamber 15 by reading one or more conventional pressure manometers connected to the chamber, to compare the measure value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to a heating unit that is used to heat the substrate 20. The heater control subroutine 87 is also invoked by the chamber manager subroutine 77a and receives a target, or set-point, temperature parameter. The heater control subroutine 87 measures the temperature by measuring voltage output of a thermocouple located in pedestal 12, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat pedestal 12, the heater control subroutine 87 gradually controls a ramp up/down of current applied to the loop. Additionally, a built-in fail-safe mode can be included to detect process safety compliance, and can shut down operation of the heating unit if the process chamber 15 is not properly set up.

The plasma control subroutine 90 comprises program code for setting the low and high frequency RF power levels applied to the process electrodes in the chamber 15, and for setting the low frequency RF frequency employed. Similar to the previously described chamber component subroutines, the plasma control subroutine 90 is invoked by the chamber manager subroutine 77a.

As described above, the plasma control subroutine 90 can include instructions for performing a post-deposition plasma treatment to remove defects of the first and second type from the surface of a deposited dielectric layer.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above-described system, such as variations in pedestal design, heater design, RF power frequencies, location of RF power connections and others are possible. For example, the wafer could be supported by a susceptor and heated by quartz lamps. The layer and method for forming such a layer of the present invention is not limited to any specific apparatus or to any specific plasma excitation method.

III. Exemplary Gas Delivery System

Figure 2:
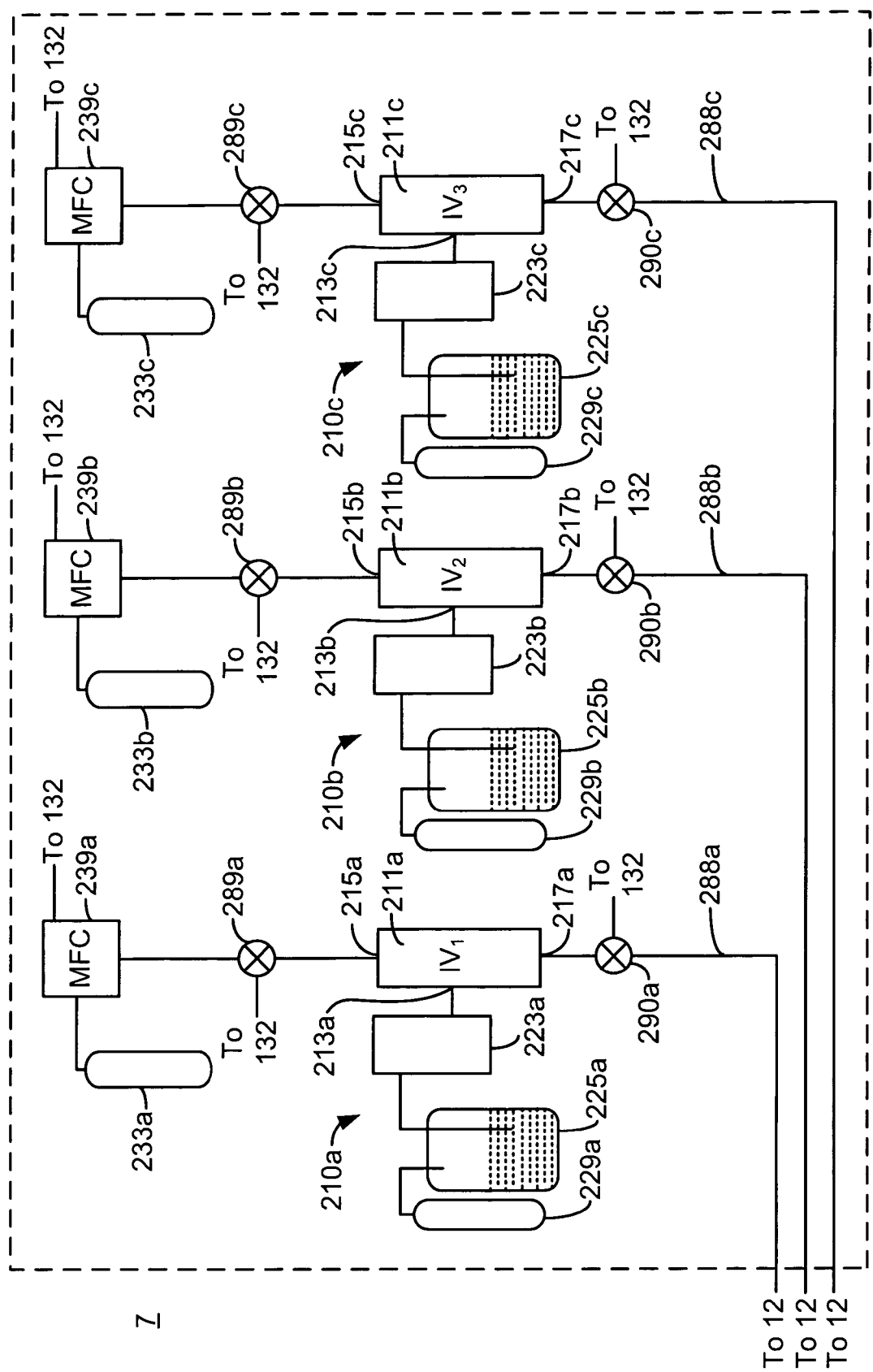
FIG. 2 is a schematic diagram of a chemical vapor deposition system including an embodiment of a gas delivery system in accordance with the present invention.

FIG. 2 is a schematic diagram of an embodiment of a plasma enhanced chemical vapor deposition (PECVD) system 10 including a gas delivery system 7 in accordance with the present invention. Embodiments in accordance with the present invention are not limited to PECVD processing, and can also be utilized in conjunction with other types of CVD processing such as high density plasma chemical vapor deposition (HDP-CVD), subatmospheric chemical vapor deposition (SACVD), and thermal CVD.

In the example of FIG. 2, the processing chamber 12 is a CVD chamber configured to deposit silicon dioxide by flowing vaporized triethylphosphate (TEPO), tetraethyl orthosilicate (TEOS), and tetraethyl borate (TEB) into the processing chamber 12. However, embodiments in accordance with the present invention are not limited to this specific application, and may include two, four, or an even greater number of separate, devoted lines for delivering a variety of gases and vaporized liquids.

Gas delivery system 7 comprises three processing liquid vaporization stages 210a-c in fluid communication with the processing chamber through devoted delivery lines 288a-c respectively. First stage 210a comprises a first injection valve 211a coupled to a source of liquid TEB 225a via a first liquid flow meter 223a. Second stage 210b comprises a second injection valve 211b coupled to a source of liquid TEOS 225b via a second liquid flow meter 223b. Third stage 210c comprises a third injection valve 211c coupled to a source of liquid TEPO 225c via a third liquid flow meter 223c. Each source of processing liquid 225a-c is coupled to a respective source of pressurized helium 229a-c.

The gas delivery system of FIG. 2 supplies carrier gas to each vaporization stage through separate carrier gas sources 233a-c controlled by separate, devoted mass flow controllers (MFCs) 239a-c respectively. Each mass flow controller is in communication with the system controller 132, allowing for control over the mass flow controller, and for monitoring of the temperature of the mass flow controller for clog-detection purposes.

The carrier gas flowed from devoted carrier gas sources 233a-c vaporizes processing liquid within stages 210a-c of gas delivery system 7, respectively. Flow into and out of vaporization stages 210a-c is controlled by valves positioned on the gas delivery lines both upstream and downstream of the vaporization stages. Specifically, upstream shut off valves 289a-c control the flow of carrier gas through lines 288a-c to vaporization stages 210a-c, respectively. Final valves 290a-c positioned downstream from vaporization stages 210a-c respectively, govern the flow of the carrier gas/vaporized liquid mixture from vaporization stages 210a-c to the mixing manifold. The outlet of the first devoted delivery line 288a, the outlet of the second devoted delivery line 288b, and the outlet of the third devoted delivery line 288c, flow to the processing chamber.

During operation, an inert carrier gas such as helium flows from the gas sources 233a-c into flow controllers 239a-c respectively, and the flow controllers 239a-c are set at a first flow rate. Within each vaporization stage 210a-c, the processing liquid is vaporized as described with reference to FIG. 3 below. Thus, a mixture of vaporized TEB and helium flows from outlet 217a of the first injection valve 211a through final valve 290a and divert valve 291a to the processing chamber. A mixture of vaporized TEOS and helium flows from outlet 217b of the second injection valve 211b through final valve 290b and divert valve 291b to the processing chamber, and a mixture of vaporized TEPO and helium flows from outlet 217c of the third injection valve 211c through final valve 290c and divert valve 291c to the processing chamber. These mixtures then flow to the processing chamber 12 where the chamber pressure and temperature causes the TEB, TEOS and TEPO to react to form a doped silicon dioxide layer on a substrate (not shown) positioned within the processing chamber 12.

Figure 3:
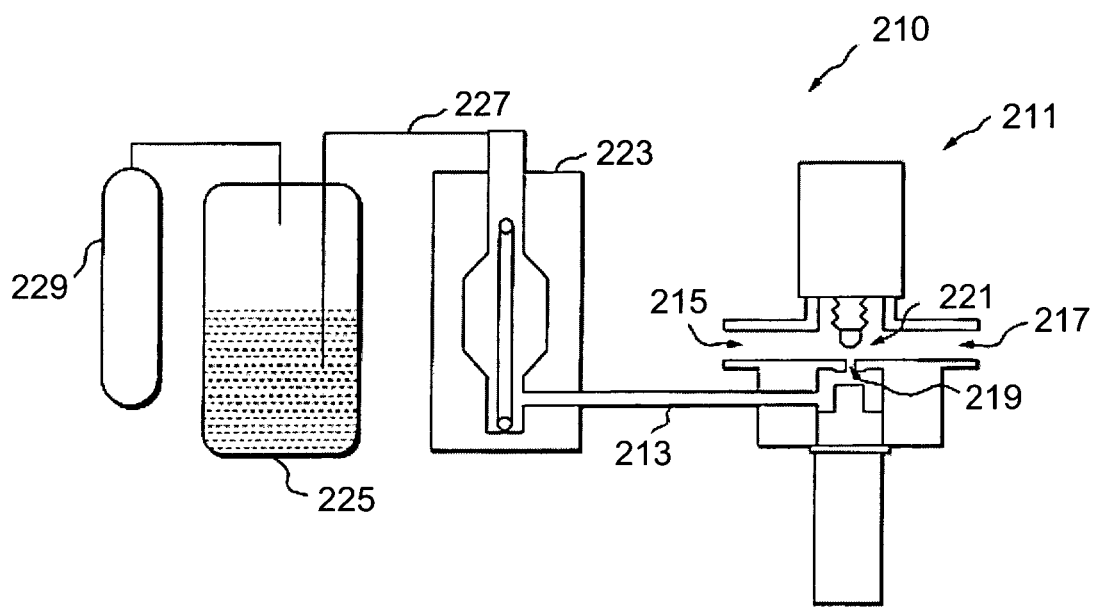
FIG. 3 is a diagrammatic side elevational view of a generic vaporization stage comprising a conventional injection valve.

FIG. 3 is a diagrammatic side elevational view of a generic vaporization stage 210 of the gas delivery system 7 shown in FIG. 2. Vaporization stage 210 comprises a conventional injection valve 211 that comprises a processing liquid inlet 213 for inputting a processing liquid, a carrier gas inlet 215 for inputting an inert carrier gas, and an outlet 217 for outputting a vaporized processing liquid/carrier gas mixture. Within each injection valve 211, the processing liquid inlet 213 terminates at an orifice 219 leading to a central gas reaction area 221 where the processing liquid inlet 213, the carrier gas inlet 215, and the outlet 217 meet. The injection valve 211 is configured such that the relative sizes of the orifice 219 and the central region 221, and the pressures, flow rates and relative direction of the processing liquid and carrier gas flow cause a pressure drop within the central region 221, as is conventionally known in the art. This pressure drop causes processing liquid supplied to the processing liquid inlet 213 to vaporize as it passes from the processing liquid inlet 213, through the orifice 219 to the central region 221.

Outside the injection valve 211, the processing liquid inlet 213 is coupled to a liquid flow meter (LFM) 223 of the vaporization stage 210 which controls the flow rate of processing liquid traveling to the injection valve 211. The liquid flow meter 223 also is coupled via line 227 to a source of processing liquid 225 within the vaporization stage 210, which in turn is coupled to a source of pressurized helium 229.

In operation, the pressurized helium flow forces the processing liquid from the processing liquid source 225 through line 227 to the liquid flow meter 223. The liquid flow meter 223 controls the flow rate of the processing liquid as it travels from liquid flow meter 223 through the processing liquid inlet 213 and the orifice 219 to the central region 221 of the injection valve 211. A pressurized carrier gas, such as helium, flows through the carrier gas inlet 215 into the central region 221.

The processing liquid vaporizes and mixes with the carrier gas as the processing liquid enters the central region 221, due to the pressure decrease experienced as the processing liquid travels from the orifice 219 to the central region 221. The combined vaporized processing liquid/carrier gas flows from injection valve 211 via outlet 217.

Figure 4:
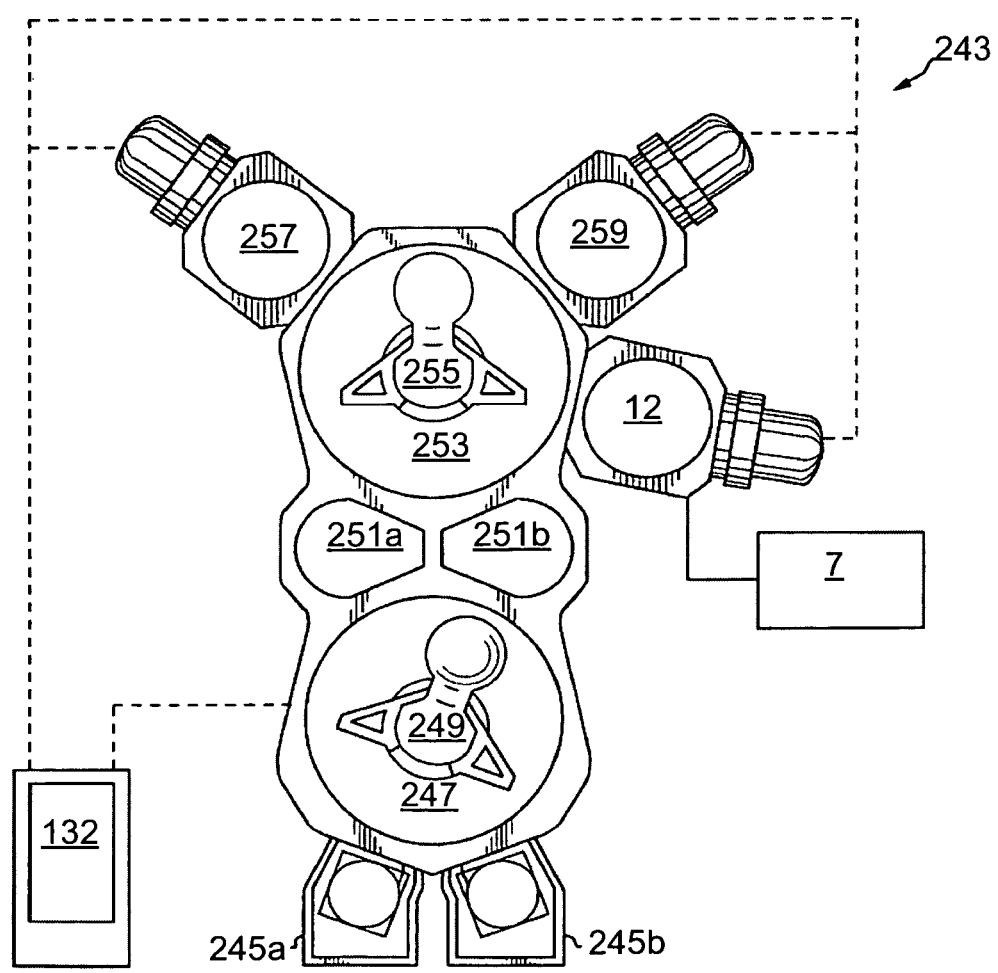
FIG. 4 is a top plan view of an automated tool for semiconductor device fabrication.

FIG. 4 is a top plan view of an automated tool 243 for fabricating semiconductor devices. The tool 243 comprises a pair of load locks 245a, 245b, and a first wafer handler chamber 247 containing a first wafer handler 249. The first wafer handler chamber 247 is operatively coupled to the pair of load locks 245a, 245b and to a pair of pass-through chambers 251a, 251b. The pair of pass-through chambers 251a, 251b are further coupled to a second wafer handler chamber 253 (e.g., a transfer chamber), containing a second wafer handler 255, and to a plurality of processing chambers 257, 259. Most importantly, the second wafer handler chamber 253 is coupled to the processing chamber 12 of FIG. 1A which is further coupled to the gas delivery system 7.

The entire tool 243 is controlled by a controller 132 (which comprises a microprocessor and a memory not shown in FIG. 4) having a program therein, which controls semiconductor wafer transfer among the load locks 245a, 245b, the pass-through chambers 251a, 251b, and the processing chambers 257, 259, 38, and which controls processing therein. As shown in FIG. 2, controller 132 is also in communication with various components of the gas delivery system 7, including mass flow controllers 239a-c, final valves 290a-c, and diversion valves 291a-c.

The controller program and the overall configuration of the tool 243 is designed to ensure optimal productivity and throughput. This means that the tool is operated to produce processed wafers bearing as few defects as possible.

The foregoing description discloses only specific embodiments in accordance with the present invention, and modifications of the above disclosed apparatuses and methods falling within the scope of the invention will be apparent to those of ordinary skill in the art. For example, the various embodiments described above offer independent approaches to reducing the incidence of defects related to the presence of non-vaporized liquid precursor on a wafer. Therefore, it should be recognized that the above-referenced techniques may be employed alone or in combination in order to reduce defects.

Thus one embodiment of an apparatus in accordance with the present invention could employ both software instructions and a hardware delay switch or other mechanism to prolong the flow of carrier gas beyond the end of flow of liquid precursor material to the vaporizer. Similarly, the software/hardware approaches utilized to ensure continued flow of carrier gas after deposition may be combined with the post-deposition plasma treatment.

And while the specific embodiment shown and described above focuses upon delivery of three particular vaporized liquids (TEOS, TEB, and TEPO) to a processing chamber, the present invention is not limited to the delivery of any specific type of vaporized processing liquid. Other liquid processing materials which may be vaporized during the fabrication of semiconductor devices include, but are not limited to, titanium tetrachloride ($TiCl_4$), trimethylsilane ($SiH(CH_3)_3$), tetramethylsilane ($Si(CH_3)_4$), tetramethylcyclotetrasiloxane (TOMCATS), octamethylcyclotetrasiloxane (OMCTS), dimethyldimethoxysilane (Z2DM), trimethyl phosphite (TMPI), trimethylphosphate (TMPO), trimethylborate (TMB), phosphorus oxychloride ($POCl_3$), boron tribromide ($BBr_3$), bis(tertiary-butylamino)silane (BTBAS), tantalum pentaethoxide (TAETO), tantalum tetraethoxide dimethylaminoethoxide (TAT-DMAE), tert-butylimino tris(diethylamino) tantalum (TBTDET), tetrakis-diethylamino titanium (TDEAT), and tetrakis-dimethylamino titanium (TDMAT).

Accordingly, while the present invention has been disclosed in connection with the preferred embodiments thereof, it should be understood that other embodiments may fall within the spirit and scope of the invention, as defined by the following claims.

What is claimed is:

1. A method of reducing incidences of defects in a stack of dielectric layers formed by chemical vapor deposition, the method comprising:
    flowing a liquid silicon-and-oxygen-containing precursor material to an injection valve;
    vaporizing the liquid silicon-and-oxygen-containing precursor material in a carrier gas flowed through the injection valve;
    causing a reaction involving the vaporized liquid silicon-and-oxygen-containing precursor material to deposit a first dielectric layer;
    halting the flow of liquid silicon-and-oxygen-containing precursor material to the injection valve at a first time while maintaining a flow of the carrier gas to the injection valve; and
    halting the flow of carrier gas to the injection valve at a second time after the first time,
    wherein a delay between halting of the flow of liquid silicon-and-oxygen-containing precursor material to the injection valve and halting the flow of carrier gas to the injection valve vaporizes the liquid silicon-and-oxygen-containing precursor material remaining in the injection valve and reduces incidences of defects in the stack of dielectric layers caused by subsequent deposition of liquid silicon-and-oxygen-containing precursor material.

2. The method of claim 1 wherein the flow of liquid silicon-and-oxygen-containing precursor material to the injection valve is halted between about 1-10 seconds before the flow of carrier gas to the injection valve is halted.

3. The method of claim 1 wherein a delay between the first time and the second time is a result of a software instruction.

4. The method of claim 1 wherein a delay between the first time and the second time is a result of physical operation of at least one of a valve and a mass flow controller.

5. The method of claim 1 wherein flowing the liquid silicon-and-oxygen-containing precursor material comprises flowing a liquid precursor material selected from the group consisting of tetraethyl orthosilicate (TEOS), tetramethylcyclotetrasiloxane (TOMCATS), octamethylcyclotetrasiloxane (OMCTS), and dimethyldimethoxysilane (Z2DM).

6. The method of claim 1 wherein flowing the carrier gas comprises flowing a carrier gas selected from the group consisting of nitrogen, helium, argon, N2O, and combinations thereof.

* * * * *

UNITED STATES PATENT AND TRADEMARK OFFICE
CERTIFICATE OF CORRECTION

PATENT NO. : 7,608,300 B2  Page 1 of 1
APPLICATION NO. : 10/650941
DATED : October 27, 2009
INVENTOR(S) : Bencher et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 780 days.

Signed and Sealed this

Twelfth Day of October, 2010

David J. Kappos
*Director of the United States Patent and Trademark Office*